(12) United States Patent
Iwabuchi et al.

(10) Patent No.: US 7,541,134 B2
(45) Date of Patent: Jun. 2, 2009

(54) ANTIREFLECTIVE FILM-FORMING COMPOSITION, METHOD FOR MANUFACTURING THE SAME, AND ANTIREFLECTIVE FILM AND PATTERN FORMATION METHOD USING THE SAME

(75) Inventors: Motoaki Iwabuchi, Joetsu (JP); Yoshitaka Hamada, Joetsu (JP); Tsutomu Ogihara, Joetsu (JP); Takeshi Asano, Joetsu (JP); Takafumi Ueda, Joetsu (JP); Dirk Pfeiffer, New York, NY (US)

(73) Assignees: International Business Machines Corporation, Armonk, NY (US); Shin-Etsu Chemical Co., Ltd, Tokyo (JP)

( * ) Notice: Subject to any disclaimer, the term of this patent is extended or adjusted under 35 U.S.C. 154(b) by 195 days.

(21) Appl. No.: 11/150,565

(22) Filed: Jun. 10, 2005

(65) Prior Publication Data

US 2005/0277058 A1    Dec. 15, 2005

(30) Foreign Application Priority Data

Jun. 10, 2004    (JP) .............................. 2004-172222

(51) Int. Cl.
*G03F 7/11* (2006.01)
*G03F 7/039* (2006.01)
*G03F 7/095* (2006.01)

(52) U.S. Cl. .................. 430/272.1; 528/41; 528/43; 438/952; 430/270.1

(58) Field of Classification Search .................. None
See application file for complete search history.

(56) References Cited

U.S. PATENT DOCUMENTS

| | | | |
|---|---|---|---|
| 3,741,932 A * | 6/1973 | Smith ........................... 534/726 |
| 4,822,716 A * | 4/1989 | Onishi et al. ................. 430/192 |
| 5,100,503 A | 3/1992 | Allman et al. |
| 5,158,854 A * | 10/1992 | Imamura et al. ............. 430/192 |
| 5,248,750 A * | 9/1993 | Takarada et al. .............. 528/15 |
| 5,270,116 A * | 12/1993 | Melancon et al. ............ 428/447 |
| 5,457,003 A * | 10/1995 | Tanaka et al. ................ 430/176 |
| 6,054,254 A | 4/2000 | Sato et al. |
| 6,114,085 A * | 9/2000 | Padmanaban et al. ..... 430/270.1 |
| 6,251,562 B1 | 6/2001 | Breyta et al. |
| 6,268,113 B1 | 7/2001 | DeBoer et al. |
| 6,268,457 B1 | 7/2001 | Kennedy et al. |
| 6,340,734 B1 * | 1/2002 | Lin et al. ........................ 528/15 |
| 6,382,620 B1 | 5/2002 | Gaarder et al. |
| 6,391,999 B1 * | 5/2002 | Crivello ........................ 528/12 |
| 6,420,088 B1 | 7/2002 | Angelopoulos et al. |
| 6,503,692 B2 | 1/2003 | Angelopoulos et al. |
| 6,506,497 B1 | 1/2003 | Kennedy et al. |
| 6,506,997 B2 | 1/2003 | Matsuyama |
| 7,163,778 B2 * | 1/2007 | Hatakeyama et al. ..... 430/272.1 |
| 2001/0036998 A1 | 11/2001 | Sakamoto et al. |
| 2002/0042020 A1 * | 4/2002 | Gallagher et al. ......... 430/272.1 |
| 2002/0058205 A1 * | 5/2002 | Nakashima et al. ....... 430/285.1 |
| 2002/0195419 A1 * | 12/2002 | Pavelchek ..................... 216/16 |
| 2003/0209515 A1 * | 11/2003 | Pavelchek ..................... 216/16 |
| 2004/0191479 A1 * | 9/2004 | Hatakeyama et al. ........ 428/141 |
| 2005/0277755 A1 * | 12/2005 | Hamada et al. ............... 528/32 |
| 2005/0277756 A1 * | 12/2005 | Iwabuchi et al. .............. 528/38 |

FOREIGN PATENT DOCUMENTS

| | | |
|---|---|---|
| JP | 63138353 | 6/1988 |
| JP | 5-27444 A | 2/1993 |
| JP | 6-138664 A | 5/1994 |
| JP | 95069611 | 7/1995 |
| JP | 2001053068 | 2/2001 |
| JP | 2001092122 | 4/2001 |
| JP | 2001343752 | 12/2001 |
| WO | WO 00/77575 | 12/2000 |

OTHER PUBLICATIONS

English translation of JP, 06-138664, A (1994) from machine translation from AIPN Japan Patent Office Natinal center for Industrial Property Information and Training, generated Mar. 26, 2008, 9 pages.*
Publication No. JP63138353, esp@cenet document, one page, English abstract of JP63-138353 published Jun. 10, 1988, applicant Tokyo Ohka Kogyo Co Ltd, submitted Jul. 2008.*
Tom Lynch, Valerie Paradis, Mark Spak, Wayne Moreau *Properties and Performance of Near UV Reflectivity Control Layers*, Proceedings of SPIE May 1994, pp. 225-229, vol. 2195.
Qinghuang Lin, et al., *A High Resolution 248 nm Bilayer Resist*, Proceedings of SPIE, Mar. 1999, pp. 241-250, vol. 3678.

* cited by examiner

*Primary Examiner*—Cynthia Hamilton
(74) *Attorney, Agent, or Firm*—Alston & Bird LLP

(57) ABSTRACT

The present invention provides a material for an antireflective film characterized by high etching selectivity with respect to a resist, that is, which has a fast etching speed when compared to the resist, and in addition, can be removed without damage to a film which is to be processed. The present invention also provides a pattern formation method for forming an antireflective film layer on a substrate using this antireflective film-forming composition, and a pattern formation method that uses this antireflective film as a hard mask, and a pattern formation method that uses this antireflective film as a hard mask for processing the substrate. The present invention also provides an antireflective film-forming composition comprising an organic solvent, a cross linking agent, and a polymer comprising a light absorbing group obtained by hydrolyzing and condensing more than one type of silicon compound, a crosslinking group and a non-crosslinking group.

8 Claims, 3 Drawing Sheets

ANTIREFLECTIVE FILM-FORMING COMPOSITION, METHOD FOR MANUFACTURING THE SAME, AND ANTIREFLECTIVE FILM AND PATTERN FORMATION METHOD USING THE SAME

FIELD OF THE INVENTION

The present invention relates to effective intermediate layer forming materials that are effective for a multilayer resist process used in micro fabrication in the manufacturing of semiconductor devices or the like; resist pattern formation methods which employ these intermediate film forming materials and which methods are suited for exposure to far ultraviolet radiation, KrF excimer laser light, ArF excimer laser light (193 nm), $F_2$ laser light (157 nm), $Kr_2$ laser light (146 nm), $Ar_2$ laser light (126 nm), soft X-rays, electron beams, ion beams, and X-rays; substrates; and in particular a masking layer used when processing an insulating film with a low dielectric constant.

DESCRIPTION OF THE RELATED ART

In recent years, the increased integration and higher speeds of LSIs have resulted in a need for pattern rules to be made even finer. The fundamental resolution limit due to the wavelength of the light source in lithography using light exposure, which at present is adopted as the standard technology, is approaching.

There is wide use of light exposure in which the g-line (436 nm) or the i-line (365 nm) of a mercury lamp is employed as a light source in lithography for forming resist patterns. One effective means to achieve even greater fineness has been to shorten the wavelength of the exposure light. Short wavelength KrF excimer laser light (248 nm) has therefore come to be used in place of the i-line (365 nm) as the exposure light source in the mass production process of 64 Mbit DRAM processing methods. However, a light source with an even shorter wavelength is required to manufacture DRAMs with a degree of integration greater than 1G, which requires even finer processing technologies (processing dimensions of 0.13 µm or less), and as such, lithography employing ArF excimer lasers (193 nm) in particular has been investigated.

In the initial stages of KrF lithography, a stepper was developed by combining an achromatic lens or a reflective optical system, for example, with a broadband light. However, because the precision of achromatic lenses or aspherical reflective optical systems was not adequate, the combination of narrow-band laser light and a refractive optical system became mainstream. It has been well documented that in single wavelength exposure, typically there is interference between incident light and light reflected by the substrate, generating a stationary wave. It is also known that the problem known as halation occurs as a result of light being focused or dispersed due to level differences in the substrate. The stationary wave and the halation both cause dimensional fluctuations in the line width of the pattern, collapse of the shape and others. The use of coherent monochromatic light allows the wavelength to be shortened but also further amplifies stationary waves and halation. Thus, providing a light-absorbing agent in the resist or applying an antireflective film on the resist surface or on the substrate surface were proposed as methods for inhibiting halation and stationary waves. However, the method of adding a light-absorbing agent resulted in the problem that the resist pattern shape became tapered. The problem of stationary waves and halation effecting fluctuations in pattern dimensions has become worse in conjunction with the shortening of wavelengths and the progress in providing greater fineness in recent years, and this could not be solved by the method of adding a light-absorbing agent.

An upper-layer transmission-type antireflective film in principle is effective only in reducing stationary waves, and is not effective for halation. Further, the refractive index of an upper-layer antireflective film that completely cancels out stationary waves is ideally a value of the square root of the refractive index of the resist. Thus, when the refractive index of polyhydroxystyrene-based resist for KrF is 1.8, this refractive index of the antireflective film is ideally 1.34. When the refractive index of alicyclic acrylic resist for ArF is 1.6, this refractive index of the antireflective film is ideally 1.27. Perfluoro-based materials are the only materials having such low refractive indices. Since in terms of processing it is advantageous that the upper-layer antireflective film can be stripped away during alkali developing, it is necessary that the material is water-soluble. Due to this, when a hydrophilic group is introduced into extremely hydrophobic perfluoro-based material to make it water-soluble, the refractive index increases, taking on a value of about 1.42 in the case of KrF and about 1.5 in the case of ArF. Thus, when patterning of 0.20 µm or less is attempted in KrF lithography, the combination of a light-absorbing agent and the upper-layer antireflective film alone cannot suppress the effects of stationary waves. In the case of ArF, the effects of the upper-layer antireflective film can be hardly expected due to the reasons mentioned above. Even in the case of KrF, it will be necessary to provide an antireflective film below the resist due to difficult management of the line width caused by further future reductions in the line width.

The antireflective film on a highly reflective substrate such as polysilicon or aluminium and under the resist achieves a very large effect of allowing reflection from the substrate to be reduced to 1% or less by setting a material of the antireflective film with an ideal refractive index (n value) and light absorption coefficient (k value) to a suitable film thickness.

The materials for the antireflective film can be broadly divided into inorganic and/or organic materials. A SiON film is an example of an inorganic material. This film is formed by CVD employing a mixture gas of silane and ammonia, for example, and has the advantage that the burden of etching on the resist is small because it has a large etching selection ratio with respect to the resist. Because the film is not easily stripped away, however, there is a limit as to when it can be employed. Furthermore, a basic substrate containing nitrogen atoms easily results in footing in a positive resist and an undercut profile in a negative resist. Organic materials are advantageous in that their film can be formed by spin coating so that they do not require special devices for CVD, sputtering or the like; it can be stripped away at the same time as the resist; and it can be of a straightforward pattern shape in which tailing or the like does not occur and has good adherence with respect to the resist layer. Thus, many antireflective films with an organic material base have been proposed. For example, there is a material comprising the condensate of a diphenylamine derivative and a formaldehyde-modified melamine resin, an alkali-soluble resin and a light-absorbing agent, set forth in JP07-69611B. These materials is produced by, a method of adding a light-absorbing group to a binder polymer or introducing a light-absorbing group to a polymer. However, since most light-absorbing agents have aromatic groups or double bonds, there is the shortcoming that addition of a light-absorbing agent may increase the dry etching resistance and that the dry etching selection ratio with respect to the resist may not be particularly high. Fine processing techniques are becoming more advanced and there is a drive to make resist films thinner, and moreover, in next-generation ArF exposure, acrylic or alicyclic polymers will come to be employed as the resist material, and this will result in a drop in the etching resistance of the resist. Etching is therefore a crucial issue, and there is a demand for antireflective films with a high etching selection ratio with respect to the resist, that is, with a fast etching speed.

A large number of pattern formation methods in which a silicon polymer is used as the lower layer resist film have been proposed. JP05-27444A, JP06-138664A, JP2001-53068A, JP2001-92122A and JP2001-343752A propose silica glass layers and silsesquioxane polymer materials which also have the effect of antireflective films. Furthermore, U.S. Pat. No. 6,420,088 and JP2003-502449A propose materials which function as both a reflecting film whose base is a silsesquioxane polymer, or a spin-on-glass material, respectively, and as a hard mask. However, in each of these silicon-containing polymers there was a problem with preservation stability, and there was the critical flaw that the film thickness fluctuates when the polymers are put into practical use. Furthermore, resist pattern shapes on the films formed by crosslinking these spin-on-glass materials with siloxane are not perpendicular, and abnormalities occur such as tailing, reverse taper and film residue. It would appear that this diffusion migration of acids or bases from the resist material to the antireflective film layer, or from the antireflective film layer to the resist material is occurring in gaps between the siloxane linkages.

With the advance of increased integration of integrated semiconductor circuits, there is a need for fine processing technology of a higher degree. Furthermore, in the processing technology of next generation semiconductor devices that are based particularly on ULK/copper conductors, there is a need for processing methods that maximize the use of materials that do not have sufficient chemical or physical strength.

Particularly in relation to the processing technology of low dielectric Si-based materials having a dielectric constant of not more than 2.7, there is a need to re-examine the entire process of washing, etching, CMP and the like, and to find new suitable materials.

For example, in the dual-damascene manufacturing process with the via-first process, Richard Spear, et al. propose a spin-on-glass based material as an antireflective coating/filling material (JP2003-502449A, U.S. Pat. No. 6,268,457 and U.S. Pat. No. 6,506,497). They also propose a spin-on-glass material with no antireflective effects as a filling material for processing of low dielectric films.

The spin-on-glass materials have a high structural similarity to low dielectric silica-based films so that there are no problems in pattern shapes during CF-based dry etching processing. However, during oxygen-based etching processing the low dielectric silica-based film is more susceptible to damage. Furthermore, it is difficult to obtain a high selective ratio when wet stripping, and either stripping is not possible, or if it is possible then shape control is problematic.

On the other hand, if an organic material based filling material is used, then when CF dry etching during the low dielectric film processing after the oxygen-based dry etching process, there is the problem that shape abnormalities can easily occur in the vicinity of the interface between the organic film and the low dielectric film.

Furthermore, silicone-based materials are capable of providing excellent etching selectivity between themselves and carbon-based organic material resists. However, it is more difficult to obtain excellent selectivity, particularly with dry etching, between silicon-based materials and insulating films that are silicon-based materials. Even in wet stripping, excluding the case in which there is a large difference in the degree of condensation, it is not easy to obtain a high selection ratio. Furthermore, problems occur such as intermixing in the upper layer of the resist pattern, or tailing in the cross-section if a material of a low degree of condensation is used so as to obtain the desired selective ratio. In addition, the degree of condensation rises while passing through the etching or the baking process, so that it has been found that it is not possible to provide an etching selective ratio as high as might be expected.

SUMMARY OF THE INVENTION

An object of the present invention is to provide a material for an antireflective film which has high etching selection ratio with respect to the resist performing a fast etching speed when compared to the resist, and which can form an excellent pattern in an upper resist layer due to the formation of a dense film by crosslinking of organic groups. Furthermore, it is to provide a processing method for a silicon-based low dielectric film, particularly one having dielectric constant of not more than 2.7 and having chemical and physical stabilities so that that the problems described above can be solved at once. The present invention provides a new silicon-based filling material, and a pattern formation method for forming an antireflective film layer on a substrate using this antireflective film material, and a pattern formation method that uses this antireflective film as a hard mask for processing the substrate.

One of the characteristics demanded of an antireflective film is the absence of intermixing with the resist and the absence of diffusion of low-molecular components to the resist layer (Proc. SPIE Vol. 2195, p 225-229 (1994)). Thermal crosslinking by baking after spin coating the antireflective film is typically employed as the method for preventing the above. Moreover, it is desirable that the resist pattern on the antireflective film or the film under the resist layer is vertical in shape without tailing or undercutting. This is because in the tailing shapes, dimensional conversion differences occur after etching the antireflective film, whereas the undercut shapes, toppling of the resist pattern occurs after developing.

Proc. SPIE Vol. 3678, p 241-250 (1999) reports that crosslinking in the presence of acid is effective in reducing tailing in positive-type resists. The method of adding a crosslinking agent and carrying out crosslinking in the presence of acid is crucial in antireflective film materials, and in JP2001-92122A and JP05-27444A the addition of a crosslinking agent is regarded as effective.

The inventors of the present invention have found that it is possible to obtain excellent lithography characteristics, excellent etching selectivity between organic materials, and storage stability through acid crosslinking by organic functional groups of a resin comprising principally a silicone-based material.

According to present invention, it is required to function as a hard mask when processing the substrate, and to be removable after processing.

The move towards highly integrated and high speed semiconductor integrated circuits of recent years has led to a need for an insulating layer with lower dielectric constants for the purpose of decreasing volume between wiring. Low dielectric constant film has been investigated for substituting for conventional silicone oxidized film by insulating film of low specific dielectric constant. Conventional silicon film formed on the low dielectric insulating film has similar characteristics to the insulating film, so that it cannot be selectively removed. Furthermore, according to the investigations of the inventors, it has been found that films formed by crosslinking of organic functional groups are more resistant to dry etching than the low dielectric insulating films, and even with wet stripping, the low dielectric insulating films are not damaged, and their removal is problematic. To solve this problem, there is a need for a material capable of changing film characteristics between a step in which it functions as an antireflective film, and a step in which it is removed.

To solve the problem, the inventors have found that a silicone film obtained by organic crosslinking has no intermixing and no dispersion of low molecular weight components into the resist layer, has an excellent etching ratio compared to the resist, and is also capable of functioning as an antireflective film by containing light absorbing groups. One advantage of silicone resin is that it is less susceptible to deterioration by heat. However the present invention uses a reverse conception, such that by incorporating thermally decomposable non-crosslinking organic group into the resin, it is possible to control the open density of the organic crosslinks, and develop a thermally decomposable composition that does not ceramicize. That is to say, the inventors have found that by appropriately thermally decomposing the organic group portion of the composition, wet stripping speed can be advanced, and wet stripping selectivity with the low inductance insulating film can be obtained.

In the present invention, provides An antireflective film-forming composition, comprising:
an organic solvent;
an acid generator; and
a polymer expressed by Formula (1) which is a copolymer comprising monomer units Ua, Ub and Uc:

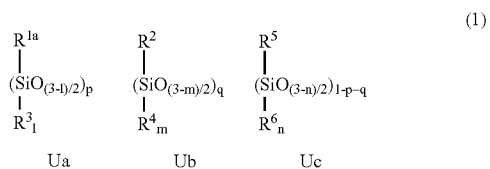

and a polymer expressed by Formula (2) which is a copolymer comprising monomer units Ua', Ub and Uc:

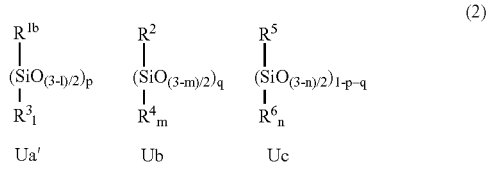

wherein $R^{1a}$ is a monovalent organic group capable of crosslinking; $R^2$ is a monovalent organic group comprising a light absorbing group being capable or incapable of crosslinking; $R^5$ is a monovalent organic group incapable of crosslinking; $R^3$ is a hydroxyl group, an alkyl group having 1 to 6 carbon atoms, an alkoxy group having 1 to 4 carbon atoms, or a group selected from the groups described in $R^2$ or $R^5$; $R^4$ is a group selected from the groups described in $R^{1a}$, $R^3$ or $R^5$; $R^6$ is a group selected from the groups described in $R^{1a}$, $R^3$ or $R^2$; $R^{1b}$ is a monovalent organic group capable of crosslinking, obtained by modifying $R^{1a}$; p is a number in the range $0<p<1$, and q is a number in the range $0<q<1$, with proviso of $p+q<1$; l, m and n are numbers in the range not less than 0 and not more than 1, independently.

The present invention also provides a pattern formation method for forming a pattern on a substrate through lithography, comprising:

a step of applying the antireflective film-forming composition according to any one of claims 1 to 10 onto a substrate;

a step of crosslinking the polymer to form an antireflective film layer, while keeping a time and a lower temperature short and low enough to prevent t the light absorbing group and/or the crosslinking group and/or the non-crosslinking group in the polymer comprised in the antireflective film-forming composition from decomposing and leaving from the polymer;

a step of applying a photoresist film material onto the antireflective film layer;

a step of prebaking the applied photoresist film material to form a photoresist film;

a step of exposing a pattern circuit region of the photoresist film on the antireflective film layer, and then developing with developing liquid to form a resist pattern on the resist film;

a step of processing the antireflective film layer and the substrate through a mask of the photoresist layer in which the resist pattern has been formed;

a step of heating the photoresist layer and the antireflective film layer at a higher temperature than a temperature at which the light absorbing group and/or the crosslinking group and/or the non-crosslinking group in the crosslinked polymer decomposes, and in a condition in which SiC is not formed; and a step of removing the photoresist layer and the antireflective film layer.

It should be noted that exposure is preferably performed using high energy radiation at a wavelength of 300 nm or less or an electron beam.

The present invention may also provide an antireflective film obtained by applying the antireflective film-forming composition onto a substrate and baking the antireflective film-forming composition.

If the antireflective film-forming composition of the present invention is used particularly against exposure to short wavelength light, then by having n and k values that can demonstrate a sufficient antireflective effect, a high etching selectivity ratio, that is to say, an antireflective film can be obtained in which an etching speed of the photoresist film is sufficiently fast. Moreover, the resist pattern shape in the photoresist film on the antireflective film can be such that it is vertical without the occurrence of reverse taper or tailing. Furthermore, the resist pattern can be removed without damaging to the low dielectric film. In addition, since etching speed and strippability can be controlled by changing the composition, it can be applied to various types of processes.

DETAILED DESCRIPTION OF THE PREFERRED EMBODIMENT

Figure 1A:
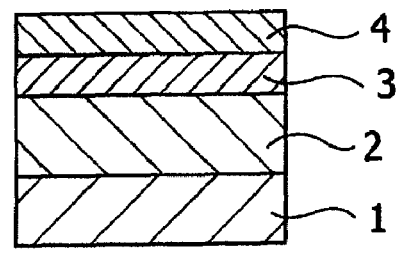
FIGS. 1(A)-(E) show a pattern formation method according to the present invention, wherein reference numeral 1 denotes a substrate, 2 denotes a low dielectric film, 3 denotes an antireflective film, 3' denotes an antireflective film in which organic groups are thermally decomposed, and 4 denotes a photoresist film.
Figure 1B:
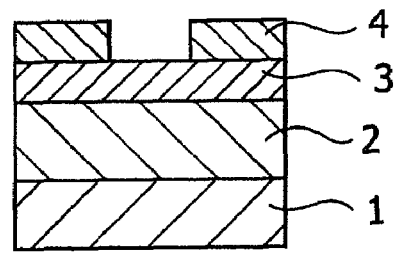

The present invention is described in further detail below. An antireflective film-forming composition according to an embodiment of the present invention comprises an organic solvent; an acid generator; and a polymer expressed by a Formula (1), which is a copolymer comprising monomer units Ua, Ub and Uc, and/or a polymer expressed by a Formula (2), which is a copolymer comprising monomer units Ua', Ub and Uc.

The polymer that is shown in the Formula (1) is hereby explained. In the Formula (1), $R^{1a}$ is a monovalent organic group capable of crosslinking. The monovalent organic group that capable of crosslinking is capable of reacting with crosslinking agents and/or organic groups other than $R^5$ in Formula (1), which is defined later. More specifically, examples of $R^{1a}$ may include a hydroxyl group, ester group or epoxy group, preferably an epoxy group so that it can react with a crosslinking agent. The organic group refers to a substituent comprising carbon.

A preferable monovalent organic group serving as $R^{1a}$ may be an organic group in which one or more hydrogen atoms of linear, branched, or cyclic alkyl groups having 1 to 20 carbon atoms are substituted by a hydroxyl group, and an organic group esterified by carboxylic acid having not more than 4 carbon atoms.

Examples of $R^{1a}$ include monovalent organic groups comprising carbon directly bonded to Si, which is contained within a polymer obtained by polymerizing the following silicon-containing monomer unit.

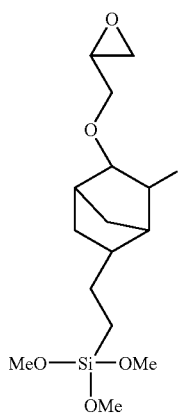
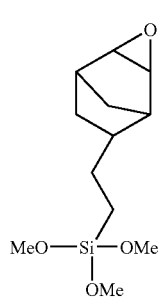

-continued

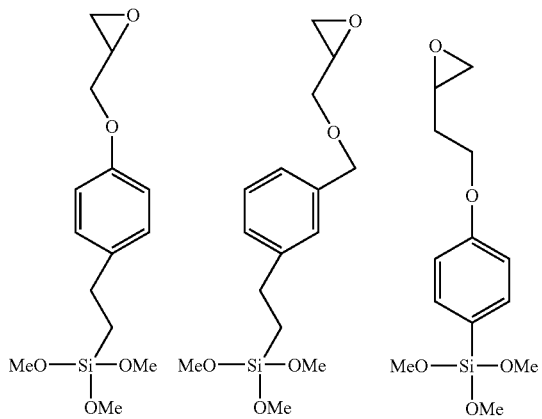
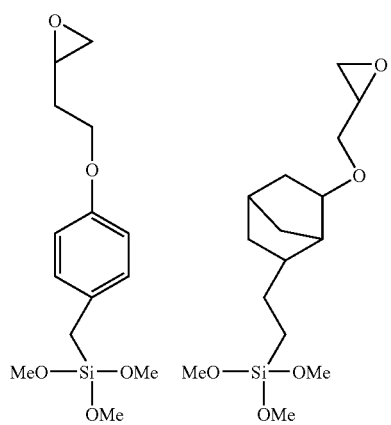
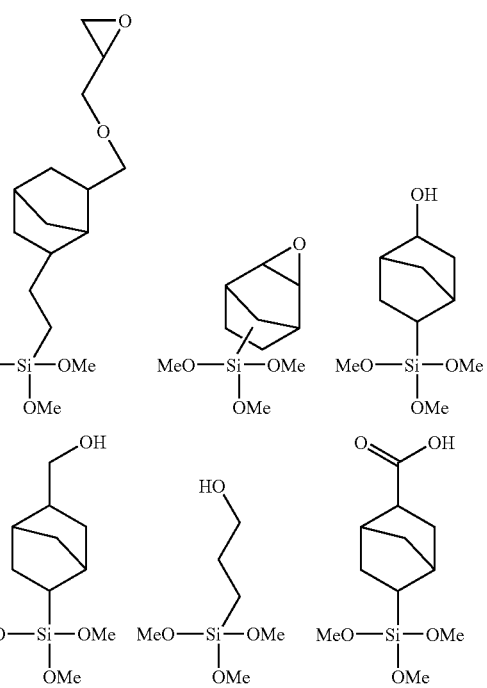

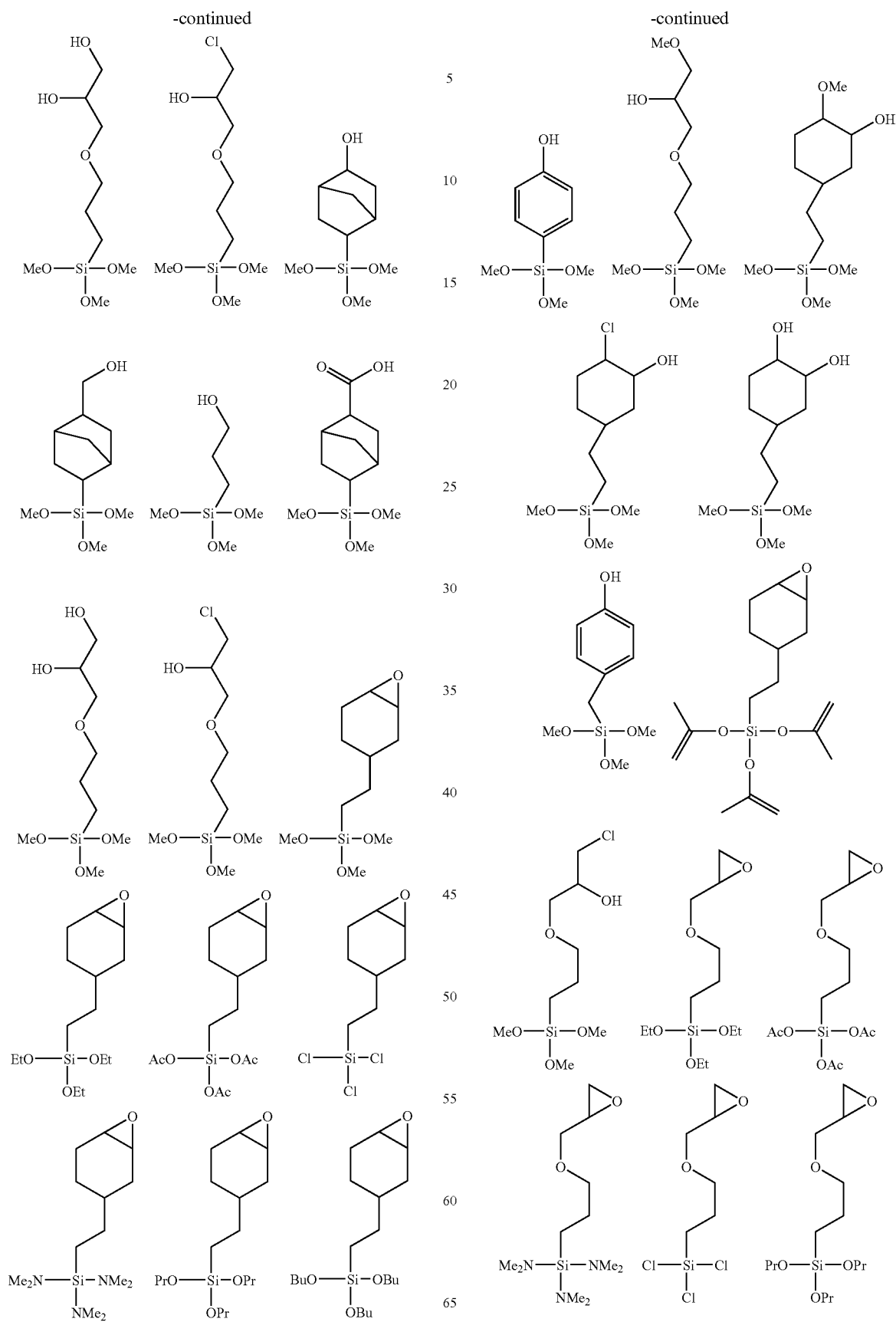

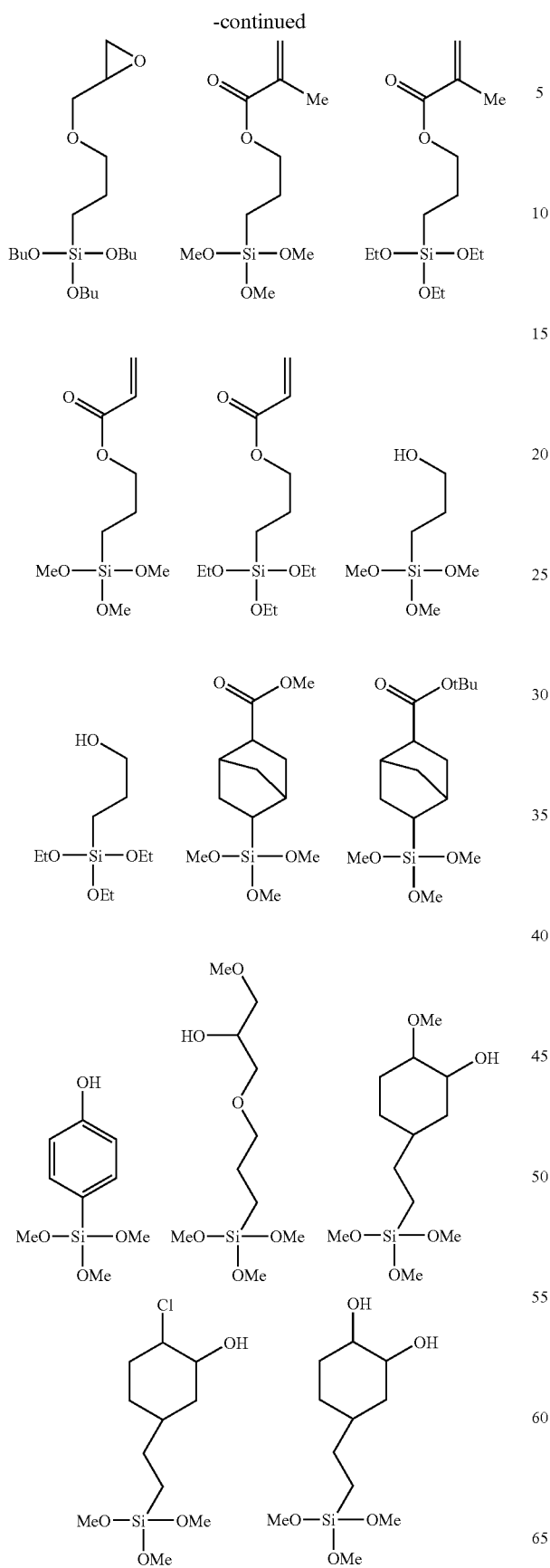
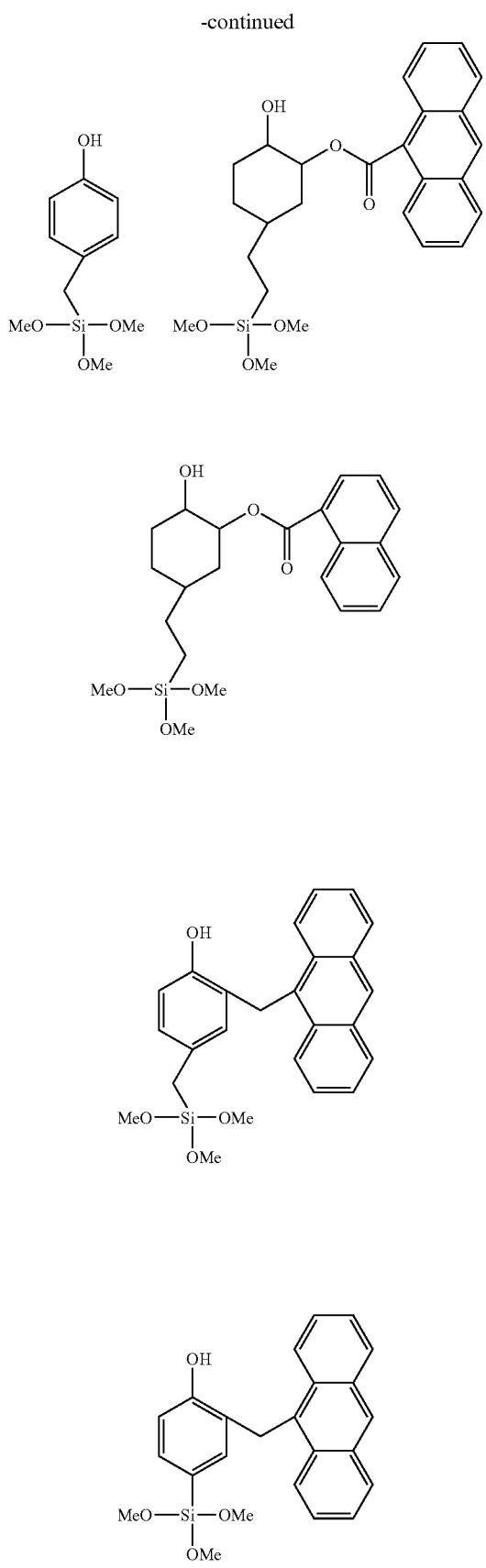

-continued
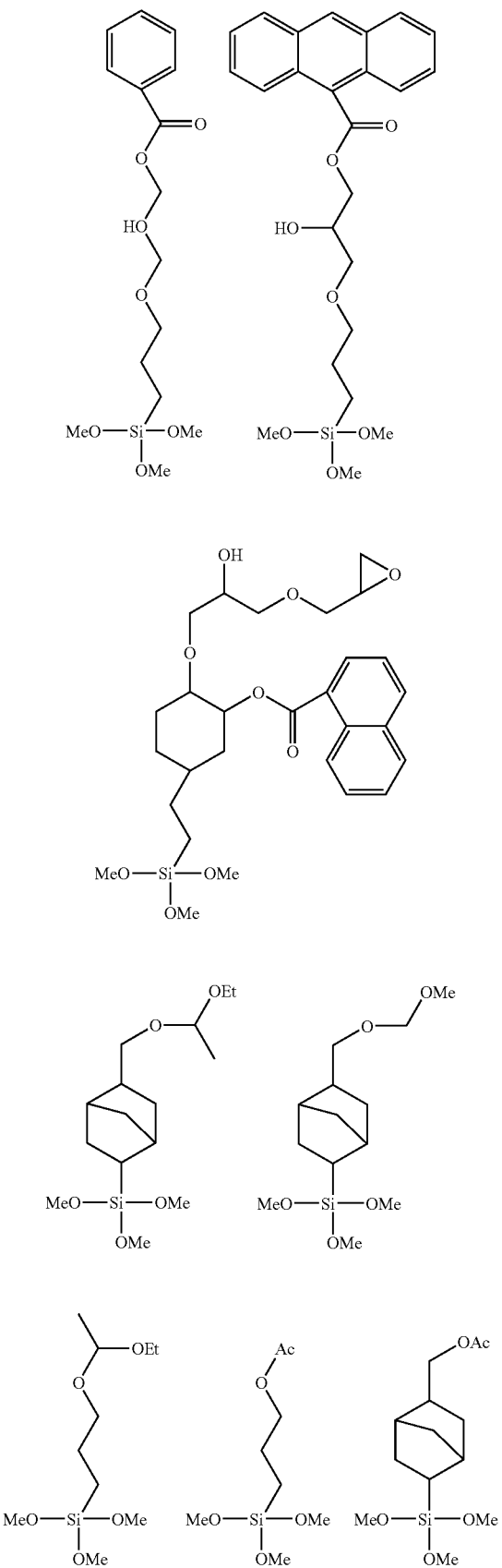
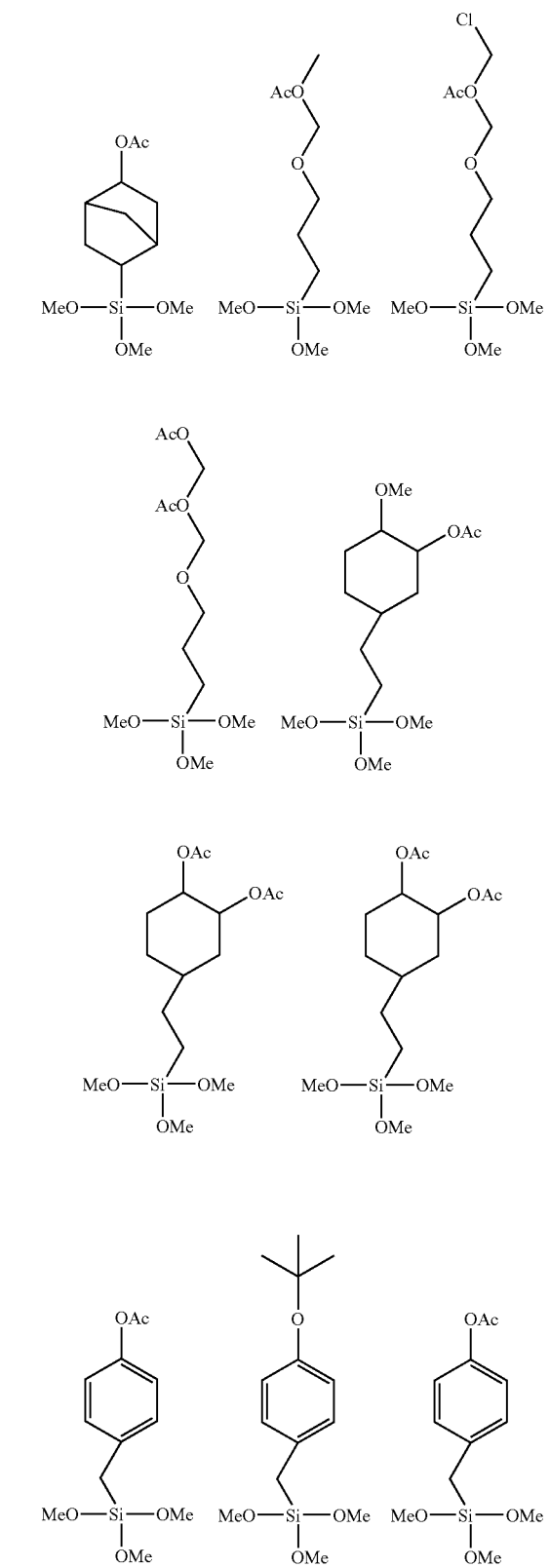

-continued

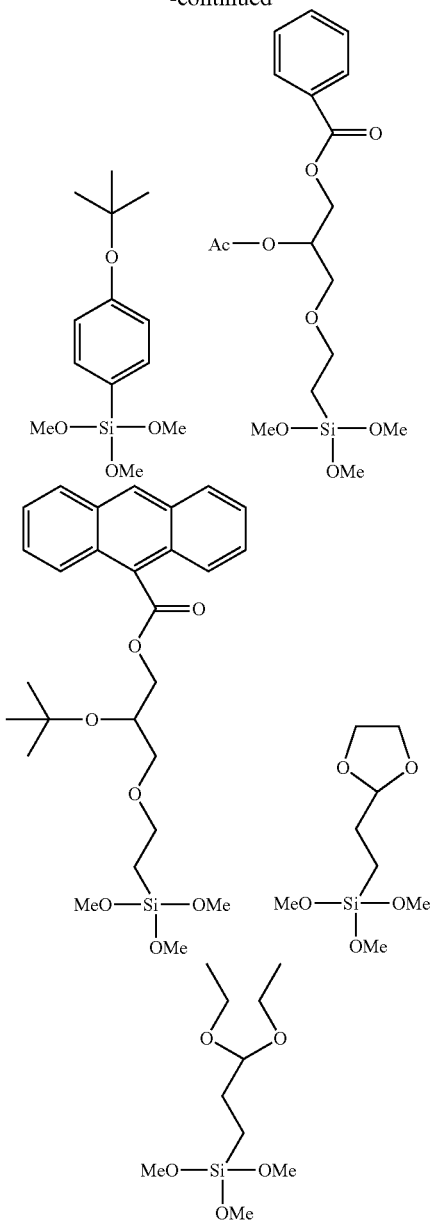

The alkoxy, acetoxy (CH₃COO), and acetal (C₂H₅OCH (CH₃)O, t-butoxy, t-amyloxy) groups in the examples of $R^{1a}$ described above can be converted into hydroxy groups by deblocking during or after polymerization of the polymer expressed by Formula (1).

$R^2$ is a monovalent organic group comprising at least one light-absorbing group, which can absorb light at wavelengths between 150 to 300 nm. The light-absorbing group may be capable of crosslinking or incapable of crosslinking. Examples of light-absorbing group preferably include an anthracene ring, a naphthalene ring, a benzene ring, or one of these rings comprising one or more substituents. Preferably, the substituent(s) is, for example, an alkoxy, acyloxy, or acetal group having 1 to 6 carbons, and more preferably is a methoxy, t-butoxy, t-amyloxy, acetoxy, or 1-ethoxy group. Examples of $R^2$ include monovalent organic groups comprising carbon directly bonded to Si, which is contained within a polymer obtained by polymerizing the following silicon-containing monomer unit.

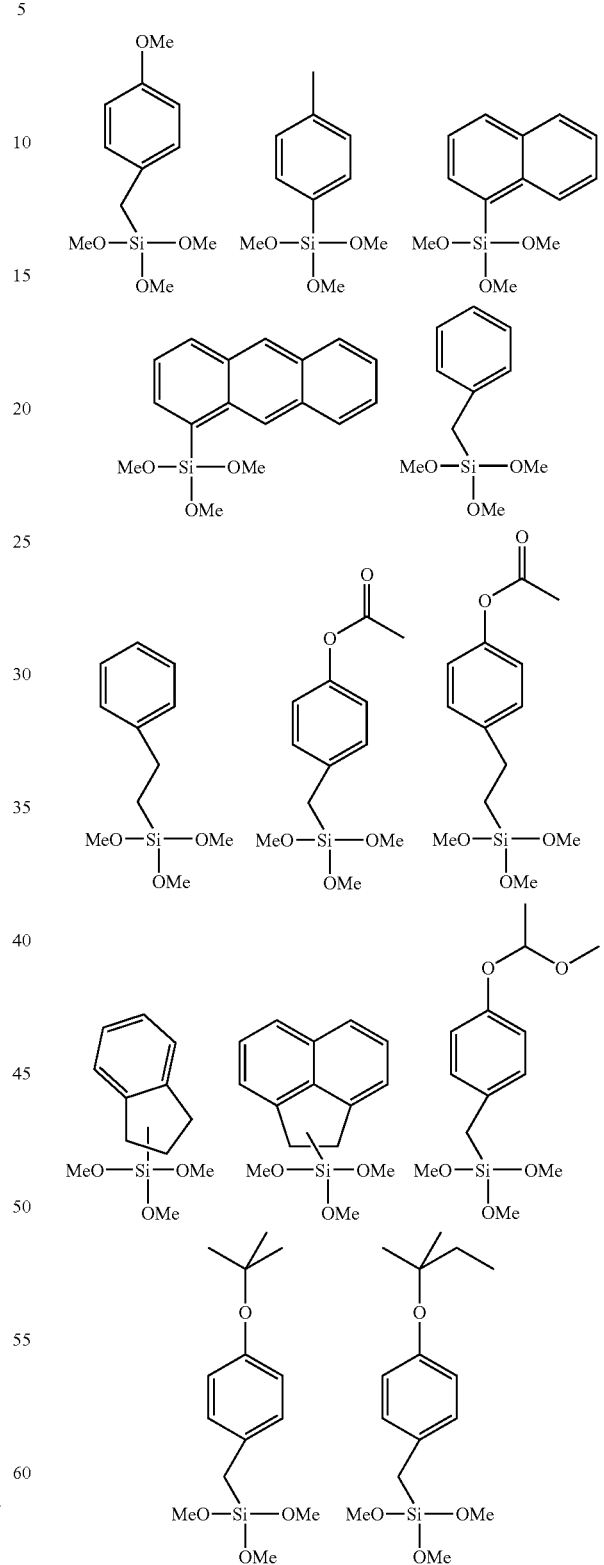

The alkoxy, ester (RCOO), and acetal (C₂H₅OCH(CH₃)O, t-butoxy, t-amyloxy) groups in the example of $R^2$ described above can be converted into a hydroxyl group by deblocking during or after polymerization of the polymer expressed by Formula (1).

$R^5$ is a monovalent organic group incapable of crosslinking. The organic group incapable of crosslinking is a group that does not crosslink with a crosslinking agent and/or organic groups other than $R^5$ in the Formula 1. Examples of $R^5$ include a linear, branched or cyclic alkyl group, or a linear, branched or cyclic alkyl group substituted by a group that can be stable when heated in an acid conditions, such as a primary or a secondary alkyloxy group, halogen, cyano group, silyl group or siloxy group. The $R^5$ may be contained in the polymer for controlling the crosslinking amount of the antireflective film because removal of the antireflective film by solvents is difficult if the crosslinking amount is too high. However the details, such as the added amount and the like are discussed later. Suitable examples of $R^5$ may include monovalent organic groups comprising carbon directly bonded to Si, which is contained within a polymer obtained by polymerizing the following silicon-containing monomer unit.

Bi-functional silane compounds such as dimethyldichlorosilane, dimethyldimethoxysilane, dimethyldiethoxysilane, dimethyldiacetoxysilane, dimethylbis(dimethylamino)silane, phenylmethyldichlorosilane, phenylmethyldimethoxysilane, phenylmethyldiethoxysilane, phenylmethyldiacetoxysilane and phenylmethyl bis(dimethylamino)silane; methyltrimethoxysilane, methyltriethoxysilane, methyltrichlorosilane, methyltris(dimethylamino)silane, methyltripropoxysilane, methyltributoxysilane, ethyltrimethoxysilane, ethyltriethoxysilane, ethyltrichlorosilane, ethyltris(dimethylamino)silane, ethyltripropoxysilane, ethyltributoxysilane, propyltrimethoxysilane, propyltriethoxysilane, propyltrichlorosilane, butyltrimethoxysilane, butyltriethoxysilane, butyltrichlorosilane, phenyltrimethoxysilane, naphthyltrimethoxysilane, anthracenylmethyltrimethoxysilane, phenyltriethoxysilane, phenyltrichlorosilane, t-butyltrimethoxysilane, t-butyltriethoxysilane, t-butyltrichlorosilane, neo-pentylbutyltrimethoxysilane, cyclopentyltrimethoxysilane, cyclohexyltrimethoxysilane, texyltrimethoxysilane, neo-pentyltriethoxysilane, neo-pentyltrichlorosilane, 3,3,3-trifluoropropyltrimethoxysilane, 3,3,3-trifluoropropyltriethoxysilane, 3,3,3-trifluoropropyltrichlorosilane, methyldichlorosilane, methyldimethoxysilane, methyldiethoxysilane and methyldiacethoxysilane, and tri-functional silane compounds described below.

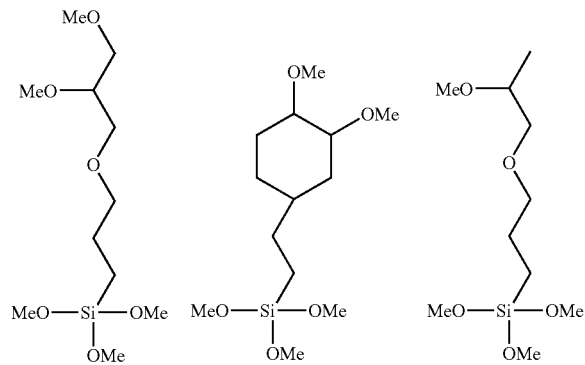

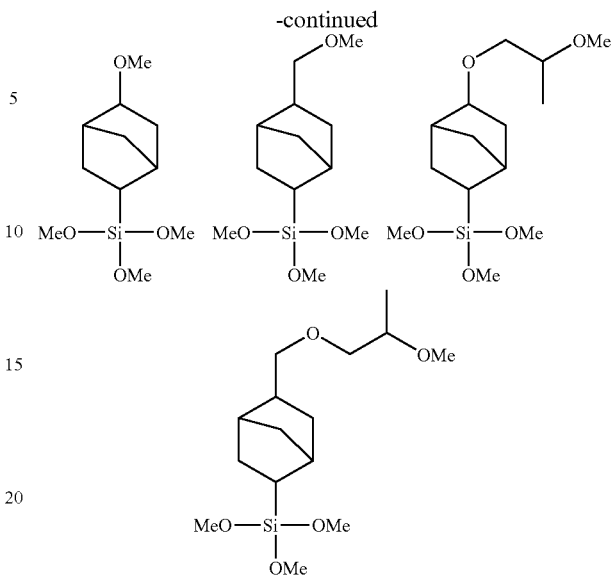

Propyl groups and ethylcyclohexyl groups that can be substituted for alkyloxy groups, which are stable in heating under acid conditions are particularly preferable.

Examples of $R^3$ may include a hydroxyl group, an alkyl group of 1 to 6 carbons, an alkoxy group of 1 to 4 carbons and groups selected from the groups described in $R^2$ or $R^5$. $R^3$ may be a group capable of crosslinking, or incapable of crosslinking.

$R^4$ is a group selected from the groups described in $R^{1a}$, $R^3$ or $R^5$. Consequently, $R^4$ may be a group capable of crosslinking, or incapable of crosslinking.

$R^6$ is a group selected from the groups described in $R^{1a}$, $R^3$ or $R^2$. Consequently, $R^6$ may be a group capable of crosslinking, or incapable of crosslinking.

In this manner, when $R^3$ in the monomer unit Ua comprised in the polymer expressed by Formula (1) is $R^2$, and when $R^4$ in the monomer unit Ub is $R^{1a}$, Ua and Ub become the same monomer unit. Similarly, when $R^3$ in the monomer unit Ua, is $R^5$ and when $R^6$ in the monomer unit Uc is $R^{1a}$, Ua and Uc become the same monomer unit. Also apart from these, depending on the selection of the groups $R^3$, $R^4$ and $R^6$, these monomer units can be the same.

l, m and n are numbers in a range that is not less than 0 and not more than 1, independently. When l, m, and n are all 1, the polymer is a linear silicone polymer, and when all of l, m, and n are 0, the polymer has a structure in three dimensions, or a ladder structure. The molar ratio of tri-functional silane to bi-functional silane may affect physical properties of the polymer such as a molecular weight, a glass transition point and the viscosity. The molar ratio can be controlled depending on the processing method of the antireflective film, and/or the adhesivity of the resist. Generally, when the three functional monomer units in the polymer are not more than 20 mol %, the glass transition point may be too low, causing nonconformities. Furthermore, the ratio of tri-functional silane to bi-functional silane can be adjusted depending on the selection of l, m and n.

A value of p is preferably 0.1 to 0.8, and is more preferably 0.2 to 0.75. A value of q is preferably 0.1 to 0.4, and more preferably 0.15 to 0.3. The values of p and q can be determined so as to achieve desired properties such as the characteristics of antireflective film, lithographic characteristics of the resist, mask characteristics and removability of inorganic insulating film etching. Furthermore the values of p and q can be determined to prevent tailing and incomplete removal of the resist.

The polymer expressed by Formula 1 may be a random co-polymer, or it may be a graft co-polymer.

The polymer expressed by Formula (1) can include monomer units such as $HSiO_{3/4}$, $SiO_{4/2}$ or $R^5{}_3SiO_{1/2}$ ($R^5$ has the same definition as the $R^5$ in the compound expressed by Formula (1)) other than described above. $HSiO_{3/4}$ and $SiO_{4/2}$ may be used as adjustment components for etching speed and stripping speed, and furthermore, $R^5{}_3SiO_{1/2}$ may be effective in increasing storage stability.

A preferable weight average molecular weight of the polymer is preferably 1,000 to 1,000,000, and more preferably 1,000 to 100,000, as converted to polystyrene, as measured based on GPC (Gel Permeation Chromatography).

In order to obtain the polymer expressed by Formula (1), the silicon-containing monomer compound shown in the formula below can be used. $R^{1a}$ to $R^6$ in the monomers a, b and c, have the same definition as those described above, and X may be a same or different, halogen atom, hydroxyl group, or alkoxy group having 1 to 6 carbons.

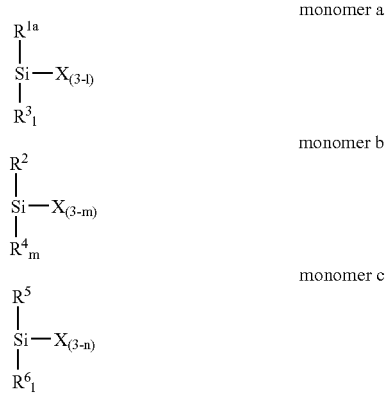

Furthermore, the polymer may be a co-polymer comprised of at least two types of each monomer. For example, monomers a of two or more different types of groups comprising different $R^{1a}$ groups, monomers b of two or more different types of groups comprising different $R^2$ groups, and monomers c of two or more different types of groups comprising different $R^5$ groups can be contained in the polymer.

The ratio of the silane monomers hydrolyzed to generate the polymer expressed by Formula (1) is described. The silane monomer ratio can be determined considering a balance among light absorption characteristics, hardenability, etching resistance and stripability of the polymer. First, the light absorption characteristics may be determined from the reflectance (n and k values) according to the necessary film thickness. The reflectance can be decided by the molar amount of the light absorbing groups per unit weight of the hardened polymer. The ratio of monomer b comprising the light absorbing group $R^2$, is preferably 0.1 to 0.4, and more preferably is 0.15 to 0.3 by the molar ratio in the polymer.

Hardenability affects the pattern of the layer on the resist. As the amount of the organic groups capable of crosslinking increases, hardenability increases, and the film becomes denser. Such films cannot be easily thermally decomposed at a relatively low temperature at which the organic groups do not form SiC. Thus, the removal of the antireflective film may be problematic. Furthermore, a passive fluorocarbon film is easily formed when etching the inorganic insulating film with fluoro-based gas, and removal of the antireflective film may be even more problematic. On the contrary, because the crosslinks become coarse when the content of the organic groups with silane being incapable of crosslinking increases, thermal breakdown becomes easier. Because removal can be carried out under mild conditions, there is no damage to the inorganic insulating film, although there is an increased chance of defects occurring in the resist pattern. In order to lower the crosslinking density, a silane containing no organic groups, or a silane comprising only small alkyl groups can be contained in the polymer. Examples of the silane include tetramethoxysilane or methyltrimethoxysilane. When increasing the silane compound, the crosslinking density is lowered. However, because the amount of $SiO_2$ increases, there is an increased chance of acid dispersion from the resist layer, and deterioration of the resist pattern. Furthermore, because etching resistance is low when etching the inorganic insulating film, etchback may occur and the pattern of the insulating film worsens. Furthermore, a high selectivity becomes difficult to obtain even for removal by wet stripping.

It is preferable that the silane composition is such that the total mass of silicon atoms and oxygen atoms directly linked to the silicon atoms in the hardened polymer may be about 20 weight % to about 70 weight % of the total weight of the hardened polymer. This is so as to satisfy the antireflective film characteristics, the lithographic characteristics of the resist, mask characteristic of the inorganic insulating film etching, and ease of removal.

The amount of groups capable of crosslinking can be varied depending on temperature of baking and/or type of resist. It is preferable that it is in the range of about 1 mmol to 7 mmol per 1 gram of the solid content of the polymer. At less than 1 mmol the crosslinks may become sparse, and tailing and incomplete removal of the resist pattern may occur. The crosslinks may become dense when the amount is more than 7 mmol/1 gram of the solid content of the polymer, and removal of the antireflective film can become problematic. It should be noted that the amount of groups capable of crosslinking described here are molar amounts of groups capable of crosslinking in 1 g of the polymer, if the hydrolyzable groups of the silane monomer are all changed to Si—O—Si and if the crosslinks are completely formed. These values do not express the amount of crosslinking groups as a physical amount in an antireflective film that is actually formed as defined, however by using such crosslinking amounts as an factor in the polymer design, the desired properties can be achieved.

The preferable range to satisfy these conditions may change greatly depending on the size of side chains of the respective silane monomers. However when the silane monomer comprising $R^1$ (monomer a), which is an organic group capable of reacting with the illustrated crosslinking agent, is used, it is preferable that the composition range of monomer a is such that the molar ratio is 0.1 to 0.8, and is more preferably 0.2 to 0.75 in the polymer.

To satisfy the preferable amount of the crosslinking group, it is effective to dose with silane monomer incapable of crosslinking (monomer c). The content of monomer c may be varied greatly depending on the size of the side chains of each constituent component similar to the case of the silane containing $R^1$. The molar ratio of monomer c is preferably selected as approximately 0.1 to 0.8 in the polymer.

Other than the monomers a, b and c, tetra-functional silane monomer compounds such as tetramethoxy silane, tetrachlorosilane, tetraacetoxysilane, tetrapropoxysilane, phenoxytrimethoxysilane, naphthoxytrimethoxysilane and anthracenemethoxytrimethoxysilane can be optionally comprised of the polymer in the amount within the above described characteristics can be obtained.

Next, the polymer comprising monomer units Ua', Ub and Uc expressed by the Formula (2) is explained.

In the Formula (2), $R^{1b}$ is a monovalent group capable of crosslinking. $R^{1b}$ can be obtained by denaturing the $R^{1a}$ described above. Here, denaturing generically refers to modifying sidechain of the silicon-containing monomer, which may be relatively easy to obtain, or modifying the monomer to generate a monomer that is suitable for its object, or after polymerizing the monomer, chemically changing the functional group on the side chain to modify it such that the polymer matches its object. Examples of the denaturing include reacting a carboxylate compound with an epoxy group to generate an ester and a hydroxyl group, reacting an alcohol compound with a hydroxyl group to generate an ether, or reacting the carboxylate compound with an alcohol group to generate an ester. More specifically, $R^{1b}$ can be an organic group having at least one group selected from the group consisting of a carbon-oxygen single bond, a carbon-oxygen double bond, an alkylcarbonyloxy group, an acetoxy group and an alkoxy group.

It should be noted that, when synthesizing the polymer expressed by Formula (2), $R^{1a}$ can be denatured to $R^{1b}$ before the step of hydrolyzing the monomer a, and can be denatured at any step desired until the polymer expressed by Formula (1) is obtained. In particular, denaturing of the polymer may be important if denaturing the monomer is difficult because of the relationship to the hydrolyzing group on the silicon, or when introducing functional groups into the polymer is preferable, which groups are unstable under the polymerizing conditions.

$R^2$, $R^3$, $R^4$, $R^5$ and $R^6$ in Formula (2) have the same definition as those in the polymer expressed by Formula (1). According to the definition of Formula (1), $R^4$ and $R^6$ may be the same as $R^{1a}$. When the polymer expressed by Formula (1) is denatured to form the polymer expressed by Formula (2), all the $R^{1a}$ may be denatures to $R^{1b}$, or some of the $R^{1a}$ remains undenatured.

The values of l, m and n, the values of p, q and r and the type of copolymer and the molecular weight of the polymer expressed by Formula (2) can all be determined in a similar manner to those of the polymer expressed by Formula (1).

As far as the conditions described above are satisfied, the polymer of the present invention can be manufactured by any method. A method for manufacturing the present invention is described in more detail below.

The polymer expressed by Formula (1) of the present invention can be synthesized through condensation and hydrolyzation, by causing the hydrolyzing silane compounds (monomers a, b and c), or mixtures thereof those to contact water.

A hydrolyzing and condensing catalyst which can be used in the method include acid catalysts such as hydrochloric acid, nitric acid, acetic acid, acetic acid, maleic acid, oxalic acid, sulfuric acid, perchloric acid, citric acid and solid acids; and basic catalyst such as ammonia, methylamine, triethylamine, sodium hydroxide, potassium hydroxide, tetramethylammonium hydroxide, and DBU solid bases and the like. It is preferable that the amount of catalyst is in a range of 0.01 to 100 mol % with respect to 1 mol of silane monomer. If the amount of catalyst is less than 0.01 mol %, the speed of the hydrolysis and condensation reactions is slow and impractical. Even if the amount added is greater than 100 mol %, there is no further gain in characteristics, and it is impractical due to cost and because neutralizing in the downstream processes becomes complicated.

Where necessary, it is also possible to add an organic solvent to the silane monomer and water hydrolyzing system. Examples of the solvent are pentane, hexane, heptane, octane, benzene, toluene, xylene, acetone, methanol, ethanol, butanol, ethyleneglycol monobutyl ether, diethyleneglycol monobutyl ether, triethyleneglycol monobutyl ether, tetraethylyleneglycol monobutyl ether, ethyleneglycol monohexyl ether, diethyleneglycol monohexyl ether, diethyleneglycol mono-2-ethylhexyl ether, ethyleneglycol monobutyl ether acetate, diethyleneglycol monobutyl ether acetate, 2-methoxyethyl acetate, propyleneglycol monomethyl ether, propyleneglycol monoethyl ether, propyleneglycol monopropyl ether, propyleneglycol monobutyl ether, dipropyleneglycol monomethyl ether, propyleneglycol monomethyl ether acetate, propyleneglycol monoethyl ether acetate, propyleneglycol-1,2-dimethyl ether, propyleneglycol diacetate, methylmethoxy acetate, dimethylketone, cyclohexanone, diisobutyl ketone, ethyl acetate, butyl acetate, 2-methylpropyl acetate, 3-methylbutyl acetate, ethyl lactate, methyl 3-methoxypropironate, cyclopentylmethyl ether, 4-hydroxy-4-methyl-2-pentanone, 3,5,5-trimethyl-1-hexanol, diethyl ether, dibutyl ether and THF, but there is no limitation to these.

The temperature range of the hydrolyzing and condensing reactions can be varied depending on the constitution of the silane monomer, the constitution and concentration of the solvent composition, and the amount of catalyst. However to allow the reaction to proceed uniformly it is preferable that the system is homogenous, and that the temperature is higher than the solid point of the reaction solvent and lower than its boiling point.

The average molecular weight of the polymer, which is the hydrolyzed/condensed product, may not be less than 100, and it is preferably 1,000 to 100,000, and even more preferably 1,000 to 10,000. When the molecular weight is too low, film formability may be inferior, and problems may occur with solubility and applicability when it is too high.

Furthermore, utilizing the hydrolyzing reaction conditions, the silane organic functional groups can be modified into crosslinking functional groups, or non-crosslinking functional groups, for example by a protection group reaction, removal from protection group reaction, a decomposition reaction, a polymerization reaction or an isomerization reaction, or a light absorbing group can be attached. Examples of groups that can be modified are alkyl groups, silyl groups, hydroxyl groups that are protected by ester groups, hydroxycarbonyl groups and amino groups. Examples of the protecting groups include methyl, ethyl, propyl, butyl, t-butyl, furfuryl alkyl, phenyl, benzyl, diphenylmethyl, methoxymethyl, ethoxymethyl, propoxymethyl, methoxyethyl, 1-ethoxyethyl, 1-methyl-1-methoxyethyl, 1-isopropoxyethyl, 3,3,3-trichloroethyl, methoxypropyl, ethoxypropyl, propoxypropyl, dimethoxypropyl, 2,2,2-trichloroethoxymethyl, 2-(trimethylsilyl)ethoxymethyl, tetrahydropyranyl, 3-bromotetrahydropyranyl, 4-methoxytetrahydropyranyl, trimethylsilyl, triethylsilyl, isopropyldimethylsilyl, t-butyldimethylsilyl, t-butyldiphenylsilyl, formyl, acetyl, 3-phenylpropionate, 3-benzoylpropionate, isobutyrate, 4-oxopentanoate, pivaloate, adamantate, benzoate, methoxycarbonyl, ethoxycarbonyl, 2,2,2-trichloroethoxycarbonyl, isobutyloxycarbonyl, and benzylcarbonate groups. Compounds that attach light absorbing groups are preferably compounds containing benzene rings, naphthalene rings and anthracene rings, while more specific examples of the compound includes phenol, 2-naphthol, 9-methanolanthracene, benzoic acid, naphthoic acid and 9-anthracencarboxylic acid, but the compound is not limited to these.

A second stage is a step of removing the catalyst from the reaction mixture. The catalyst is neutralized and deactivated, and the condensation reaction is stopped. Any inorganic or organic acid or base desired can be used to neutralize the catalyst. Organic acids and/or organic bases that are refined for use in electronics materials are preferred. Utilizing the conditions at this time, the silane organic functional groups can be converted into crosslinking functional groups, or non-crosslinking functional groups, for example by a protection group reaction, a removal from protection group reaction, a decomposition reaction, a polymerization reaction or an isomerization reaction.

By heating the solvent that containing the silane reaction mixture obtained in the second process under conditions of normal pressure and a temperature of at most 80° C., or by reducing the pressure to between 1 hPa to normal pressure under the temperature conditions of room temperature to at most 80° C., the water soluble solvent that is used as the solvent and the hydrolyzing byproducts are distilled off, and the reaction system is converted to one that is substantially made of the polymer, which is the silicone polymer of the present invention, water, and neutral salts.

In the process, it is possible to add an organic solvent capable of dissolving the polymer, before or after the distillation. Examples of the solvent are pentane, hexane, heptane, octane, benzene, toluene, xylene, acetone, methanol, ethanol, butanol, ethyleneglycol monobutyl ether, diethyleneglycol monobutyl ether, triethyleneglycol monobutyl ether, tetraethyleneglycol monobutyl ether, ethyleneglycol monohexyl ether, diethyleneglycol monohexyl ether, diethyleneglycol mono-2-ethylhexyl ether, ethyleneglycol monobutyl ether acetate, diethyleneglycol monobutyl ether acetate, 2-methoxyethyl acetate, propyleneglycol monomethyl ether, propyleneglycol monoethyl ether, propyleneglycol monopropyl ether, propyleneglycol monobutyl ether, dipropyleneglycol monomethyl ether, propyleneglycol monomethyl ether acetate, propyleneglycol monoethyl ether acetate, propyleneglycol-1,2-dimethyl ether, propyleneglycol diacetate, methylmethoxy acetate, dimethylketone, cyclohexanone, diisobutyl ketone, ethyl acetate, butyl acetate, 2-methylpropyl acetate, 3-methylbutyl acetate, ethyl lactate, methyl 3-methoxypropironate, cyclopentylmethyl ether, 4-hydroxy-4-methyl-2-pentanone, 3,5,5-trimethyl-1-hexanol, diethyl ether, dibutyl ether and THF, but are not limited to the above.

After concentration, the organic solvent is added so that the water phase is separated from the reaction mixture. However, if the organic phase and the water phase is separated by the organic solvent added in the concentration step, the organic solvent in the present step can be added optionally. The type of solvent that is added is irrelevant provided it is capable of separating the water phase. However more specific examples include pentane, hexane, heptane, octane, benzene, toluene, xylene, acetone, methanol, ethanol, butanol, ethyleneglycol monobutyl ether, diethyleneglycol monobutyl ether, triethyleneglycol monobutyl ether, tetraethyleneglycol monobutyl ether, ethyleneglycol monohexyl ether, diethyleneglycol monohexyl ether, diethyleneglycol mono-2-ethylhexyl ether, ethyleneglycol monobutyl ether acetate, diethyleneglycol monobutyl ether acetate, 2-methoxyethyl acetate, propyleneglycol monomethyl ether, propyleneglycol monoethyl ether, propyleneglycol monopropyl ether, propyleneglycol monobutyl ether, dipropyleneglycol monomethyl ether, propyleneglycol monomethyl ether acetate, propyleneglycol monoethyl ether acetate, propyleneglycol-1,2-dimethyl ether, propyleneglycol diacetate, methylmethoxy acetate, dimethylketone, cyclohexanone, diisobutyl ketone, ethyl acetate, butyl acetate, 2-methylpropyl acetate, 3-methylbutyl acetate, ethyl lactate, methyl 3-methoxypropironate, cyclopentylmethyl ether, 4-hydroxy-4-methyl-2-pentanone, 3,5,5-trimethyl-1-hexanol, diethyl ether, dibutyl ether and THF, but are not limited to the above.

It is preferable to wash the organic phase with water after the water phase is separated. Through the process, it is possible to remove salts generated by the neutralization from the catalyst, excess acids and bases used in the neutralization, and metal ions that were mixed in during the process.

In this manner, it is possible to take the solution of the polymer that is obtained by separating the water phase as the bulk liquid of the antireflective film-forming composition, however it is also possible to remove the solvent, or to substitute it for another solvent as desired.

The polymer expressed by Formula (2) can be manufactured in a similar manner by denaturing the organic group $R^{1a}$ included in the monomer a, at any of the manufacturing steps of the polymer shown in the Formula (1). For example, before hydrolysis and polymerization, the organic group $R^{1a}$ included in the monomer a can be denatured to the organic group $R^{1b}$. The organic group $R^{1a}$ included in the monomer unit Ua, which is included in the polymer that is already polymerized, can be denatured into the organic group $R^{1b}$ at the second manufacturing step of the process described above. The denaturing conditions may differ depending on the reaction. For example, if the organic group $R^{1a}$ is an epoxy group, then $R^{1a}$ is denatured to an α-hydroxycarbonyloxy group using a non-alcohol-based organic solvent, adding a carboxylic acid compound that supplements this, and reacting it for 1 to 24 hours at atmospheric pressure and 60° C. to 120° C.

If the polymer obtained by hydrolyzing the silane monomer does not have the structure that is expressed by Formula (1) or Formula (2), then the silane organic functional group must be modified by reactions such as a protection group reaction, a removal from protection group reaction, a decomposition reaction, a polymerization reaction or an isomerization reaction to change the compound to the polymer that is constituted by Formula (1) or Formula (2), which have light absorption groups, crosslinking groups and non-crosslinking groups.

Blend of the polymer expressed by Formula (1) that is obtained in this manner, and the polymer that is expressed by Formula (2) can be used in the antireflective film forming compound. For the blend ratio at this time, a balance among light absorption characteristics, hardenability, etching resistance and stripability of the polymer is considered, and the concentration of crosslinking groups that are included in the polymer is preferably more than 1 mmol per 1 gram of the solid content of the polymer, and/or the mass ratio of silicon atoms to oxygen atoms that are directly linked to silicon atoms in the polymer is set such that it is in a range of more than 20 weight % and less than 80 weight %, and is preferably more than 20 weight % and less than 70 weight %.

There is no particular limitation to the organic solvent that is contained in the antireflective film-forming composition of the present invention, provided that the organic solvent is capable of dissolving polymers, acid generators, crosslinking agents and other desired additives, and has a boiling point that is not more than 200° C. Examples of this are the organic solvents from among the examples given for the step of hydrolyzing, the step of concentrating and the step of washing. From among these organic solvents, solvents that have excellent solubility for acid generators, and excellent solubility and stability for polymers, propyleneglycol monopropylether (PGMEA), ethyl lactate (EL), propyleneglycol monopropylether and mixture thereof, are preferably used.

The amount of organic solvent that is used is 100 to 2,000 weight parts compared to 100 weight parts of the polymer that is shown in the Formula (1) and/or the polymer that is shown in the Formula (2), while 400 to 1,900 weight parts is particularly preferable.

In the antireflective film-forming composition of the present invention, the addition of acid generators that are for the purpose of further facilitating the heat induced crosslinking reaction are preferable because they prevent mixing with the resist, and prevent migration and dispersion of low molecular weight component. The acid generator can be one that generates acid by thermal degradation, or one that generates acid by light irradiation, however it is possible to add any of these.

Examples of the acid generator used in the present invention include:
(i) onium salts of the formulas (P1a-1), (P1a-2), (P1a-3), or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate ester derivatives.

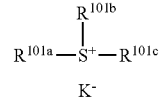
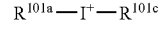
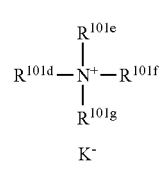

Herein, $R^{101a}$, $R^{101b}$, and $R^{101c}$ independently represent linear, branched or cyclic alkyl, alkenyl, oxoalkyl or oxoalkenyl groups having 1 to 12 carbon atoms, aryl groups having 6 to 20 carbon atoms, or aralkyl or aryloxoalkyl groups having 7 to 12 carbon atoms, wherein part or all of the hydrogen atoms of these groups can be substituted by alkoxy or other groups. $R^{101b}$ and $R^{101c}$ together can form a ring, and if forming a ring, $R^{101b}$ and $R^{101c}$ each represent alkylene groups having 1 to 6 carbon atoms. K represents a non-nucleophilic counter ion. $R^{101d}$, $R^{101e}$, $R^{101f}$, and $R^{101g}$ are $R^{101a}$, $R^{101b}$, and $R^{101c}$ to which hydrogen atoms have been added. $R^{101d}$ and $R^{101e}$, and $R^{101d}$ and $R^{101e}$ and $R^{101f}$, can form rings, and if forming a ring, $R^{101d}$ and $R^{101e}$, and $R^{101d}$ and $R^{101e}$ and $R^{101f}$ are independently alkylene groups having 3 to 10 carbon atoms.

$R^{101a}$, $R^{101b}$, $R^{101c}$, $R^{101d}$, $R^{101e}$, $R^{101f}$ and $R^{101g}$ can be the same or different, and specifically may be alkyl groups such as methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclo-hexyl, cyclohexylmethyl, norbornyl, and adamantyl.

Examples of alkenyl groups include vinyl, allyl, propenyl, butenyl, hexenyl, and cyclohexenyl. Examples of oxoalkyl groups include 2-oxocyclopentyl and 2-oxocyclohexyl, in addition to 2-oxopropyl, 2-cyclopentyl-2-oxoethyl, 2-cyclohexyl-2-oxoethyl, and 2-(4-methylcyclohexyl)-2-oxoethyl.

Examples of aryl groups include phenyl and naphthyl, alkoxyphenyl groups such as p-methoxyphenyl, m-methoxyphenyl, o-methoxyphenyl, ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl.

Examples of aralkyl groups include benzyl, phenylethyl, and phenethyl. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion indicated by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzene-sulfonate, and alkylsulfonate ions such as mesylate and butanesulfonate.

(P1a-1) and (P1a-2) can act as both photoacid generators and thermal acid generators, however (P1a-3) can act as a thermal acid generator.

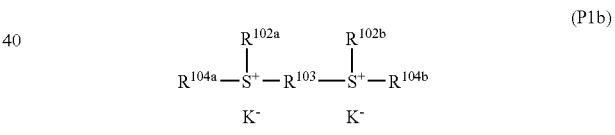

Herein, $R^{102a}$ and $R^{102b}$ each independently represents linear, branched or cyclic alkyl groups having 1 to 8 carbon atoms. $R^{103}$ represents a linear, branched or cyclic alkylene group having 1 to 10 carbon atoms. $R^{104a}$ and $R^{104b}$ each independently represents 2-oxoalkyl groups having 3 to 7 carbon atoms. K⁻ is a non-nucleophilic counter ion.

Specific examples of the groups represented by $R^{102a}$ and $R^{102b}$ include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Examples of the groups represented by $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene.

Examples of the groups represented by $R^{104a}$ and $R^{104b}$ include 2-oxopropyl, 2-oxocyclopentyl, 2-oxocyclohexyl, and 2-oxocycloheptyl. As for K⁻, the same compounds as those illustrated by the formulae (P1a-1), (P1a-2), and (P1a-3) can be used.

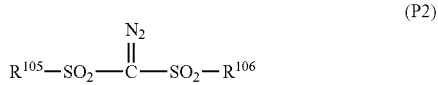

(P2)

Herein, $R^{105}$ and $R^{106}$ independently represent linear, branched or cyclic alkyl or halogenated alkyl groups having 1 to 12 carbon atoms, aryl or halogenated aryl groups having 6 to 20 carbon atoms, or aralkyl groups having 7 to 12 carbon atoms.

Examples of the alkyl groups of $R^{105}$ and $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Examples of the halogenated alkyl groups include trifluoromethyl, 1,1,1-trifluoroethyl, 1,1,1-trichloroethyl, and nonafluorobutyl. Examples of the aryl groups include alkylphenyl groups such as phenyl, p-methoxyphenyl, m-methoxyphenyl, o-methoxyphenyl, ethoxyphenyl, p-tert-butoxyphenyl, and m-tert-butoxyphenyl, and alkylphenyl groups such as 2-methylphenyl, 3-methylphenyl, 4-methylphenyl, ethylphenyl, 4-tert-butylphenyl, 4-butylphenyl, and dimethylphenyl. Examples of the halogenated aryl groups include fluorophenyl, chlorophenyl, and 1,2,3,4,5-pentafluorophenyl. Examples of the aralkyl groups include benzyl and phenethyl.

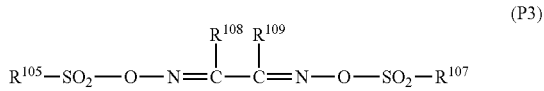

(P3)

Herein, for $R^{105}$ those defined in the Formula (P2) described above can be used. $R^{107}$, $R^{108}$, and $R^{109}$ independently represent linear, branched or cyclic alkyl or halogenated alkyl groups having 1 to 12 carbon atoms, aryl or halogenated aryl groups having 6 to 20 carbon atoms, or aralkyl groups having 7 to 12 carbon atoms. $R^{108}$ and $R^{109}$ can bond with one another to form a ring structure, and if the two form a ring structure, then $R^{108}$ and $R^{109}$ each are independently straight or branched alkylene groups having 1 to 6 carbon atoms.

Examples of the alkyl, halogenated alkyl, aryl, halogenated aryl, and aralkyl groups represented by $R^{107}$, $R^{108}$, and $R^{109}$ are the same as those described for $R^{105}$ and $R^{106}$. Examples of the alkylene groups represented by $R^{108}$ and $R^{109}$ include methylene, ethylene, propylene, butylene, and hexylene.

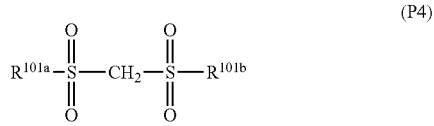

(P4)

Herein, $R^{101a}$ and $R^{101b}$ are the same as those described above.

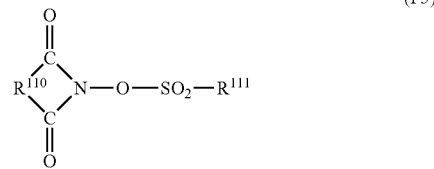

(P5)

Herein, $R^{110}$ is an arylene group having 6 to 10 carbon atoms, alkylene group having 1 to 6 carbon atoms, or alkenylene group having 2 to 6 carbon atoms, wherein it is possible to substitute part or all of the hydrogen atoms of these groups with straight or branched alkyl or alkoxy groups having 1 to 4 carbon atoms, nitro, acetyl, or phenyl groups. $R^{111}$ is a linear, branched or substituted alkyl, alkenyl, or alkoxyalkyl group having 1 to 8 carbon atoms, phenyl or naphthyl group. It is possible to further substitute part or all of the hydrogen atoms of these groups with alkyl or alkoxy groups having 1 to 4 carbon atoms, phenyl groups, which may have been substituted with an alkyl or alkoxy groups having 1 to 4 carbon atoms, nitro, or acetyl groups, hetero-aromatic groups having 3 to 5 carbon atoms, or chlorine atoms or fluorine atoms.

Suitable examples of arylene groups represented by $R^{110}$ include 1,2-phenylene and 1,8-naphthylene, illustrative alkylene groups include methylene, ethylene, trimethylene, tetramethylene, phenylethylene, and norbornene-2,3-diyl, and suitable examples of alkenylene groups include 1,2-vinylene, 1-phenyl-1,2-vinylene, and 5-norbornane-2,3-diyl. Of the groups represented by $R^{111}$, suitable examples of alkyl groups are the same as those described for $R^{101a}$ to $R^{101c}$, suitable examples of alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl, and suitable examples of alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Examples of alkyl groups having 1 to 4 carbon atoms that can be further substituted, include methyl, ethyl, propyl, isopropyl, n-butyl, isobutyl and tert-butyl, examples of alkoxy groups having 1 to 4 carbon atoms include methoxy, ethoxy, propoxy, isopropoxy, n-butoxy, isobutoxy, and tert-butoxy, and examples of phenyl groups which may be substituted with an alkyl having 1 to 4 carbon atoms, alkoxy having 1 to 4 carbon atoms, nitro, or acetyl group include phenyl, tolyl, p-tert-butoxyphenyl, p-acetylphenyl, and p-nitrophenyl. Suitable examples of heteroaromatic groups having 3 to 5 carbon atoms include pyridyl and furyl.

Examples of the acid generator described by the Formulas above more specifically include the compounds given below.

Such examples include onium salts such as tetramethylammonium trifluoromethanesulfonate, tetramethylammonium nonafluorobutanesulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethane sulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl) sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl (2-oxocyclohexyl) sulfonium trifluoromethanesulfonate, (2-norbornyl)methyl(2-oxocyclohexyl)sulfonium trifluoromethanesulfonate, ethylenebis [methyl(2-oxocyclopentyl)sulfonium trifluoromethanesulfonate], and 1,2'-naphthylcarbonylmethyltetrahydrothiophenium triflate.

Such examples include diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Such examples include glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-o-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Such examples include bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane.

Such examples include β-ketosulfone derivatives such as 2-cyclohexyl-carbonyl-2-(p-toluenesulfonyl)propane and 2-isopropyl-carbonyl-2-(p-toluenesulfonyl)propane.

Such examples include nitrobenzyl sulfonate derivatives such as 2,6-dinitrobenzyl p-toluenesulfonate and 2,4-dinitrobenzyl p-toluenesulfonate.

Such examples include sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene.

Such examples include sulfonic acid ester derivatives of N-hydroxyimide compounds such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate, however preferable among these are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl) sulfonium trifluoromethanesulfonate, (2-norbornyl)methyl (2-oxocylohexyl)sulfonium trifluoromethanesulfonate, and 1,2'-naphthylcarbonylmethyltetrahydrothiophenium triflate, diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane, glyoxime derivatives such as bis-O-(p-toluenesulfonyl)-α-dimethylglyoxime and bis-o-(n-butanesulfonyl)-α-dimethylglyoxime, bissulfone derivatives such as bisnaphthylsulfonylmethane, and sulfonic acid ester derivatives of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

As regards the above acid generators, a single type can be used alone or two or more types can be used in combination.

The amount of acid generator that is added is preferably 0.1 to 50 weight parts, and more preferably 0.5 to 40 weight parts, with respect to 100 weight parts of polymer expressed by Formula (1) or (2) (or if both are used, the total weight parts of the two). When there is less than 0.1 weight parts, too little acid is generated and the crosslinking reaction may be insufficient, whereas when there is more than 50 weight parts, there is the problem that mixing occurs due to the acid moving to the upper layer resist.

The antireflective film-forming composition of the present invention is a compound in which crosslinks are formed during film formation between organic groups that are linked to the polymer, however, the crosslinks can be formed by direct reaction between organic groups that are linked to the polymer, or the crosslinks can be formed via what is known as a crosslinking agent, which contains a plurality of functional groups that can react with the organic groups, as an additive component. With an antireflective film-forming composition in which organic groups linked to the polymer are directly bonded to one another without using low molecular weight type crosslinking materials, there is no danger of unreacted crosslinking agent dispersing from the previously formed antireflective film layer to the resist layer and adversely affecting on the pattern shape when film forming the resist in the step of pattern formation that will be described below, so that it is possible to select the temperature conditions and the like in the step of resist film forming with relative freedom. This means that it is preferable not to use crosslinking agents other than on the polymer.

On the other hand, in the pattern forming method of the present invention, it is very important to control the crosslinking density. When fine tuning the crosslinking density in a compound in which a crosslinking agent is added, adjustment is possible simply by changing the added amount of crosslinking agent, and there is merit in the fact that it is easy to manage the process, and to cope with changes in conditions of use. Furthermore, crosslinking agents can also be used for final adjustment of an antireflective film-forming composition that is manufactured fundamentally without the addition of crosslinking agents.

Examples of the crosslinking agents capable of being used in the antireflective film-forming composition of the present invention include melamine, guanamine and glycoluril compounds, in which there has been a substitution by at least one group selected from methylol, alkoxymethyl, and acyloxymethyl, or compounds that include double bonds such as urea, epoxy, thioepoxy, isocyanate and azide compounds, and alkenyl ether groups. These can be used as additives, or they can be introduced as polymer side chain pendant groups. Furthermore, compounds that include hydroxyl groups can also be used as a crosslinking agent.

Examples of epoxy compounds capable of being used as crosslinking agents include tris(2,3-epoxypropyl)isocyanurate, trimethylolmethane triglycidyl ether, trimethylolpropane triglicidyl ether and trimethylolethane triglycidyl ether.

Examples of melamine compounds include hexamethylolmelamines, hexamethoxymethylmelamines, compounds obtained by methoxymethylating from 1 to 6 hexamethylolmelamines and mixtures thereof, hexamethoxyethylmelamine, hexaacyloxymethylmelamine, and compounds obtained by acyloxymethylating 1 to 6 methylol groups of hexamethylolmelamine and mixtures thereof.

Examples of guanamine compounds include tetramethylolguanamine, tetramethoxymethylguanamine, compounds obtained by methoxymethylating 1 to 4 methylol groups of tetramethylolguanamine and mixtures thereof, tetramethoxyethylguanamine, tetraacyloxyguanamine, and compounds obtained by acyloxymethylating 1 to 4 methylol groups of tetramethylolguanamine and mixtures thereof.

Examples of glycoluril compounds include tetramethylolglycoluril, tetramethoxyglycoluril, tetramethoxymethylglycoluril, compounds obtained by methoxymethylating 1 to 4 methylol groups of tetramethylolglycoluril and mixtures thereof, and compounds obtained by acyloxymethylating 1 to 4 methylol groups of tetramethylolglycoluril and mixtures thereof.

Examples of urea compounds include tetramethylolurea, tetramethoxymethylurea, tetramethoxyethylurea, and compounds obtained by methoxymethylating 1 to 4 methylol groups of tetramethylolurea and mixtures thereof.

Examples of compounds containing an alkenyl ether group include ethyleneglycol divinyl ether, triethyleneglycol divinyl ether, 1,2-propanediol divinyl ether, 1,4-butanediol divinyl ether, tetramethyleneglycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

If the crosslinking agent of the polymer expressed by Formula (1) or Formula (2) contains an epoxy group, then it is effective to add a compound containing a hydroxy group in order to raise reactivity with the epoxy group and increase crosslinking efficiency. A compound that includes two or more hydroxy groups within the molecule is particularly preferable. Suitable examples include alcohol group containing compounds such as 4,8-bis(hydroxymethyl)tricyclo[5.2.1.02,6]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]ethtylidene] biscyclohexanol, [1,1'-bicyclohexyl]-4,4'-diol, methylene biscyclohexanol, decahydronaphthalene-2,6-diol, and [1,1'-bicyclohexyl]-3,3',4,4'-tetrahydroxy, and phenol low-nucleotides such as bisphenol, methylenebisphenol, 2,2'-methylenebis[4-methylphenol], 4,4'-methylidene-bis[2,6-dimethylphenol], 4-4'-(1-methyl-ethylidene)bis[2-methylphenol], 4-4'-cyclohexylidenebisphenol, 4,4'-(1,3-dimethylbutylidene)bisphenol, 4,4'-(1-methylethylidene)bis[2,6-di-methylphenol], 4,4'-oxybisphenol, 4,4'-methylenebisphenol, bis(4-hydroxyphenyl)methanone, 4,4'-methylenebis[2-methylphenol], 4,4'-[1,4-phenylenebis(1-methylethylidene)]bisphenol, 4,4'-(1,2-ethanediol) bisphenol, 4,4'-(diethylsilylene)bisphenol, 4,4'-[2,2,2-trifluoro-1-(trifluoromethyl)ethylidene]bisphenol, 4,4',4"-methylidenetrisphenol, 4,4'-[1-(4-hydroxyphenyl)-1-methylethyl]phenyl]ethylidene]bisphenol, 2,6-bis[(2-hydroxy-5-methylphenyl)methyl]-4-methylphenol, 4,4',4"-ethylidynetris[2-methylphenol], 4,4',4"-ethylidynetrisphenol, 4,6-bis[(4-hydroxyphenyl)methyl]1,3-benzenediol, 4,4'-[(3,4-dihydroxyphenyl)methylene]bis[2-methylphenol], 4,4',4",4'''-(1,2-ethanediylidene) tetrakisphenol, 4,4',4",4'''-(ethanediylidene)tetrakis[2-methylphenol], 2,2'-methylenebis[6-[(2-hydroxy-5-methylphenyl)methyl]-4-methylphenol], 4,4',4",4'''-(1,4-phenylenedimethylidyne)tetrakisphenol, 2,4,6-tris(4-hydroxyphenylmethyl)1,3-benzenediol, 2,4',4"-methylidenetrisphenol, 4,4',4'''-(3-methyl-1-propanyl-3-ylidene)trisphenol, 2,6-bis[(4-hydroxy-3-fluorophenyl) methyl]-4-fluorophenol, 2,6-bis[4-hydroxy-3-fluorophenyl] methyl]-4-fluorophenol, 3,6-bis[(3,5-dimethyl-4-hydroxyphenyl)methyl]1,2-benzenediol, 4,6-bis[(3,5-dimethyl-4-hydroxyphenyl)methyl]1,3-benzenediol, p-methylcalix[4]arene, 2,2'-methylenebis[6-[(2,5/3,6-dimethyl-4/2-hydroxyphenyl)methyl]-4-methylphenol, 2,2'-methylenebis[6-[(3,5-dimethyl-4-hydroxyphenyl)methyl]-4-methylphenol, 4,4',4'',4'''-tetrakis [(1-methylethylidene)bis(1,4-cyclohexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

In the present invention, an extending agent can be dosed into the antireflective film-forming composition with the object of raising its solubility in the stripping fluid. Furthermore, with the same object, holes can be introduced in the antireflective film by dosing an extending agent (Pologen), applying the composition and forming the crosslink in a film by crosslink reaction, and then baking. Because the extending agent and the holes generally increase the speed of dry etching when fluorocarbon-based gases are used, they can be used to control the etching speed of the antireflective film, if for example, use of a resist whose etching resistance is low is unavoidable. Moreover, when the antireflective film is dissolvably removed by solution, the holes assist solubility, and can be used for making dissolution easier. In the step of pattern forming described below, the step of baking can be performed at the same time as crosslinking the polymer that is contained within the antireflective film-forming composition, or it can be inserted just before the step of removing the antireflective film. It is preferable that the extending agents or Pologen that can be used here are organic polymers that have low reactivity with the polymers contained with the antireflective film-forming composition, and specific example include polyether, acrylic resin and methacrylic resin.

The present invention provides a method for forming a pattern on a substrate through lithography, comprising: a step of applying the antireflective film-forming composition according to the present invention onto a substrate; a step of crosslinking the polymer to form an antireflective film layer, while keeping a time and a temperature short and low enough to prevent the light absorbing group and/or the crosslinking group and/or the non-crosslinking group in the polymer comprised by the antireflective film-forming composition from decomposing and leaving from the polymer; a step of applying a photoresist film material onto the antireflective film layer; a step of prebaking the applied photoresist film material to form a photoresist film; a step of exposing a pattern circuit region of the photoresist film on the antireflective film layer, and then developing with developing liquid to form a resist pattern on the resist film; a step of processing the antireflective film layer and the substrate through a mask of the photoresist layer in which the resist pattern has been formed; and a step of removing the photoresist layer and the antireflective film layer.

Furthermore, the present invention also provides a method for forming a pattern on a substrate through lithography, comprising: a step of applying the antireflective film-forming composition according to the present invention onto a substrate; a step of crosslinking the polymer to form an antireflective film layer, while keeping a time and a temperature short and low enough to prevent the light absorbing group and/or the crosslinking group and/or the non-crosslinking group in the polymer comprised by the antireflective film-forming composition from decomposing and leaving from the polymer; a step of applying a photoresist film material onto the antireflective film layer; a step of prebaking the applied photoresist film material to form a photoresist film; a step of exposing a pattern circuit region of the photoresist film on the antireflective film layer, and then developing with developing liquid to form a resist pattern on the resist film; a step of processing the antireflective film layer and the substrate through a mask of the photoresist layer in which the resist pattern has been formed; a step of heating the photoresist layer and the antireflective film layer at a higher temperature than a temperature at which the light absorbing group and/or the crosslinking group and/or the non-crosslinking group in the crosslinked polymer decomposes, and in a condition in which SiC is not formed; and a step of removing the photoresist layer and the antireflective film layer.

The present invention provides an antireflective film-forming composition suitable for wet stripping when a substrate is a low dielectric film, an antireflective film made by the composition and a method for pattern forming characterized in that the antireflective can be removed by wet stripping process.

The pattern formation methods according to the present invention are described with reference to FIG. 1. First, the procedure up to resist pattern formation shown in FIG. 1(A) is described. An antireflective film 3 can be formed by applying the antireflective film-forming composition of the present invention onto a low dielectric constant material 2, which is laminated onto a substrate 1 through spin coating or the like. After application by spin coating or the like, the organic solvent is vaporized and preferably baking is performed to advance the crosslinking reaction in order to prevent mixing with a photoresist film 4, which becomes the upper layer. The baking temperature is within a range in which the organic groups of the polymer do not break down, and is preferably within a range of 80 to 250° C. and the baking time is preferably within a range of 10 seconds to 300 seconds.

After the antireflective film 3 has been formed, the photoresist film 4 is formed thereon. This is preferably done through spin coating as when forming the antireflective film 3. Prebaking is performed after the photoresist film material has been applied by spin coating or the like, and the prebake conditions are preferably a temperature within the range of 80 to 180° C. and a baking time within a range of 10 to 300 seconds. FIG. 1(A) is obtained by this process. Next, the pattern circuit region is exposed, subjected to a post-exposure bake (PEB), and developed with the developing liquid, yielding a resist pattern (FIG. 1(B)).

Figure 1C:
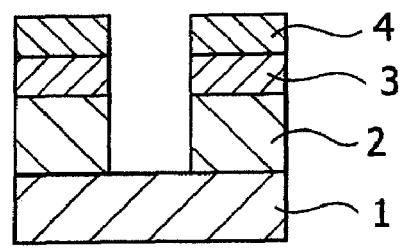
Figure 1D:
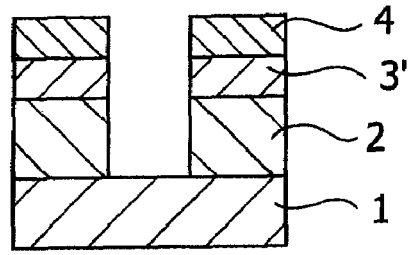
Figure 1E:
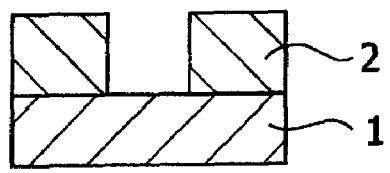

Next, the antireflective film 3 is etched with the photoresist film 4 serving as a mask, and this etching is carried out using fluorocarbon, nitrogen, or carbon dioxide gases, for example, copying the pattern onto the low dielectric constant layer 2 (FIG. 1(C)). The antireflective film 3 formed from the antireflective film-forming composition of the present invention is characterized in that it is quickly etched by the gas and that there is little reduction of the above photoresist film 4.

Next, the resist film 4 and the antireflective film 3 that remained after etching are heated for 1 to 60 min. Thus, the organic groups of the antireflective film 3 thermally degenerate, and become an easily wet stripped antireflective film 3' (FIG. 1(D)). Conventionally, the organic resist film 4 is removed by plasma, however because the strength of the low inductance layer 2 is chemically and physically weak, it may be damaged at the same time. Furthermore, in conventional antireflective films, the film is too strong, such that removal is problematic even by wet stripping, however by heating the antireflective film 3 provided by the present invention, it can be removed by wet stripping fluid without damaging the low dielectric film 2 (FIG. 1(E)).

However, when the condition during heating is too severe, the layer turns to ceramic, that is, inorganic SiC is formed. When SiC is formed, wet stripping fluid solubility tends to decrease. Because of this, it is preferable that heating in the heating process does not exceed 450° C., and instead is preferably between 180° C. to 400° C., and is even more preferably between 250° C. to 400° C. If it is less than 180° C. then the increase in solubility is not obtained, and if it is more than 400° C., a slight extension of the suitable heating time can form SiC generation and create problems when wet stripping.

The resist composition used to form the resist layer can be a publicly known composition, and for example it is possible to use a combination of a base resin, an organic solvent, and an acid generator.

As the base resin of the resist composition, it is possible to use polyhydroxystyrene or derivatives thereof, polyacrylic acid or derivatives thereof, polymethacrylic acid or derivatives thereof, copolymers formed from hydroxystyrene, acrylic acid and derivates thereof, copolymers with three or more monomer units selected from cycloolefin and derivatives thereof, maleic anhydride, and acrylic acid and derivatives thereof, copolymers with three or more monomer units selected from cycloolefin and derivatives thereof, maleimide, and acrylic acid and derivatives thereof, and one or more high-molecular polymers selected from the group consisting of polynorbornene and a product of ring-opening metathesis polymerization. It should be noted that the derivatives described above refers to compounds in which the primary backbone remains after derivation, such that acrylic acid derivatives include acrylic ester, methacrylic acid derivatives include methacrylic ester, and hydroxystyrene derivates include alkoxystyrene. In this manner, the present invention provides a method for pattern formation that includes forming a pattern on a substrate.

WORKING EXAMPLES

Hereinafter the present invention is described in further detail through manufacturing examples, working examples and comparative examples but the present invention is not limited to the following descriptions.

Manufacturing Example 1

252 g of ultrapure water, 770 g of ethanol and 440 g of 10% tetramethylammonium hydroxide solution were prepared in a 3 L flask, to which a fluid mixture of 27 g of 3-acetoxypropyltrimethoxysilane, 14 g of phenyltrimethoxysilane and 51 g of 3-(2'-methoxypropoxy)propyltrimethoxysilane was added, and mixed well in a nitrogen atmosphere at 30° C. After one hour, 35 g of acetic acid was added, and the ethanol and methanol were removed by distillation at reduced pressure (100 hPa) 900 g of ethyl acetate was added to the remaining liquid, and after separating the water phase, the organic phase was washed 5 times with 300 g of ultrapure water. Into the organic phase 200 g of propylene glycol monomethyl ether acetate was added, concentrated under reduced pressure (20 hPa), yielding 250 g of a solution of a polymer 1. The non-volatile matter was 16 wt %.

Manufacturing Example 2

84 g of ultrapure water, 256 g of ethanol and 29 g of 10% tetramethylammonium hydroxide solution were prepared in a 1 L flask, to which a fluid mixture of 7.5 g of 2-acetoxymethyl-bicyclo[2.2.1]heptanyltrimethoxysilane, 6.3 g of phenyltrimethoxysilane and 22.4 g of 3-(2'-methoxypropoxy)propyltrimethoxysilane was added, and mixed well in a nitrogen atmosphere at 30° C. After one hour, 1.6 g of acetic acid was added, and the ethanol and methanol were removed by distillation at reduced pressure (100 hPa). 300 g of ethyl acetate was added to the remaining liquid, and after separating the water phase, the organic phase was washed 5 times with 70 g of ultrapure water. Into the organic phase 100 g of propylene glycol monomethyl ether acetate was added, concentrated under reduced pressure (20 hPa), yielding 85 g of a solution of a polymer 2. The non-volatile matter was 28 wt %.

Manufacturing Example 3

595 g of ethanol and 75 g of 10% tetramethylammonium hydroxide solution were prepared in a 3 L flask, to which a fluid mixture of 102 g of 3,4-epoxycyclohexylethyltrimethoxysilane, 71 g of tetraethoxysilane, 35 g of phenyltrimethoxysilane and 44 g of (2,3-dimethoxypropoxy)propyltrimethoxysilane was added, and mixed well in a nitrogen atmosphere at 30° C. After one hour, 27.5 g of acetic acid was added, and the ethanol and methanol were removed by distillation at reduced pressure (100 hPa). 200 g of ethyl acetate was added to the remaining liquid, and after separating the water phase, the organic phase was washed 3 times with 240 g of ultrapure water. Into the organic phase 600 g of propylene glycol monomethyl ether acetate was added, concentrated under reduced pressure (20 hPa), yielding 600 g of a solution of a polymer 3. The non-volatile matter was 25 wt %.

Manufacturing Example 4

595 g of ethanol and 75 g of 10% tetramethylammonium hydroxide solution were prepared in a 3 L flask, to which a fluid mixture of 93.4 g of 3,4-epoxycyclohexylethyltrimethoxysilane and 109.6 g of (2,3-dimethoxypropoxy)propyltrimethoxysilane was added, and mixed well in a nitrogen atmosphere at 30° C. After one hour, 10.0 g of acetic acid was added, and the ethanol and methanol were removed by distillation at reduced pressure (100 hPa). 200 g of ethyl acetate was added to the remaining liquid, and after separating the water phase, the organic phase was washed 3 times with 240 g of ultrapure water. Into the organic phase 600 g of propylene glycol monomethyl ether acetate was added, concentrated under reduced pressure (20 hPa), and 600 g of a solution was obtained. The non-volatile matter was 25 wt %. 4.3 g of benzoic acid was added to 100 g of this solution and reacted for 12 hrs at 100° C., yielding 95 g of a solution of a polymer 4. The non-volatile matter was 29.5 wt %.

Manufacturing Example 5

120 g of ultrapure water, 375 g of ethanol and 216 g of 10% tetramethylammonium hydroxide solution were prepared in a 0.1 L flask, to which a fluid mixture of 51.4 g of 3-acetoxypropyltrimethoxysilane and 6.6 g of phenyltrimethoxysilane was added, and mixed well in a nitrogen atmosphere at 30° C. After one hour, 8 g of acetic acid was added, and the ethanol and methanol were removed by distillation at reduced pressure (100 hPa). 450 g of ethyl acetate was added to the remaining liquid, and after separating the water phase, the organic phase was washed 5 times with 100 g of ultrapure water. Into the organic phase 88 g of ethyl lactate was added, concentrated under reduced pressure (20 hPa), yielding 100 g of a solution of a polymer 5. The non-volatile matter was 14 wt %.

Manufacturing Example 6

25 g of the polymer solution 5 and 82 g of the polymer solution 1 were mixed, yielding 207 g of a solution of a polymer 6. The non-volatile matter was 17 wt %.

Manufacturing Example 7

1135 g of ultrapure water, 1135 g of ethanol and 200 g of 10% tetramethylammonium hydroxide solution were prepared in a 5 L flask, to which a fluid mixture of 82 g of methyltrimethoxysilane, 125 g of tetraethoxysilane, 24 g of phenyltrimethoxysilane and 20 g of 3-acetoxypropyltrimethoxysilane was added, and mixed well in a nitrogen atmosphere at 30° C. After one hour, 5.5 g of acetic acid and 880 g of propylene glycol monomethyl ether acetate were added. From this, the ethanol and methanol were removed by distillation at reduced pressure (100 hPa). 600 g of ethyl acetate was added to the remaining liquid, and after separating the water phase, the organic phase was washed 3 times with 600 g of ultrapure water. Into the organic phase 1200 g of propylene glycol monopropyl ether was added, concentrated under reduced pressure (20 hPa), yielding 1000 g of a solution of a polymer 7. The non-volatile matter was 10.5 wt %.

Manufacturing Example 8

541 g of ultrapure water, 1135 g of ethanol and 83 g of 10% tetramethylammonium hydroxide solution were prepared in a 3 L flask, to which 145 g of 3,4-epoxycyclohexylethyltrimethoxysilane was added, and mixed well in a nitrogen atmosphere at 30° C. After one hour, 6 g of acetic acid and 1000 g of propylene glycol monomethyl ether acetate were added. From this, the ethanol and methanol were removed by distillation at reduced pressure (100 hPa). 600 g of ethyl acetate was added to the remaining liquid, and after separating the water phase, the organic phase was washed 3 times with 600 g of ultrapure water. Concentrating this organic phase at reduced pressure (20 hPa) yielded 1000 g of a solution of the polymer 1. The non-volatile matter was 10.0 wt %. 22 g of benzoic acid was added to this solution and reacted at 100° C. for 12 hrs. 100 g of propylene glycol monomethyl ether acetate, was then added and reacted at 100° C. for 12 hrs. After that, unreacted propylene glycol monomethyl ether acetate was removed by distillation at reduced pressure (20 hPa), and 800 g of a solution of a polymer 8 was obtained. The non-volatile matter was 19.6 wt %.

Manufacturing Example 9

915 g of ultrapure water, 1884 g of ethanol and 103 g of 10% tetramethylammonium hydroxide solution were prepared in a 5 L flask, to which a fluid mixture of 434 g of methyltrimethoxysilane and 662 g of tetraethoxysilane was added, and mixed well in a nitrogen atmosphere at 40° C. After four hours, 10 g of acetic acid and 1800 g of propylene glycol monomethyl ether acetate were added. From this, the ethanol and methanol were removed by distillation at reduced pressure (100 hPa). 1200 g of ethyl acetate was added to the remaining liquid, and after separating the water phase, the organic phase was washed 3 times with 1200 g of ultrapure water. Into the organic phase 2400 g of propylene glycol monopropyl ether was added, concentrated under reduced pressure (20 hPa), yielding 2400 g of a solution of a polymer 9. The non-volatile matter was 16.4 wt %.

Working Examples 1 to 5 and Comparative Examples 1 to 3

Using the polymer solutions obtained in the Manufacturing Examples 1 to 8 described above, adding the acid generators and crosslinking agents shown in Table 1 and diluting such that the solid content (the polymer plus the acid generator and the crosslinking agent) in the solution is 10 wt %, the antireflective film-forming composition was prepared by filtering through a PTFE filter membrane having a pore size of 0.1 μm.

The various components in Table 1 are as follows:

Polymer 1 to 8: Polymers obtained through Manufacturing Examples 1 to 8

Crosslinking Agent: HMM (See structural formula below)

Acid Generator: BBI-109 (Acid Generator produced by Midori Kagaku Co., Ltd)

Surfactant: Surfactant produced by 3M Co., Ltd.

Organic Solvent: PGMEA (propylene glycol monomethyl ether acetate), PnP (propylene glycol monopropyl ether) and EL (ethyl lactate)

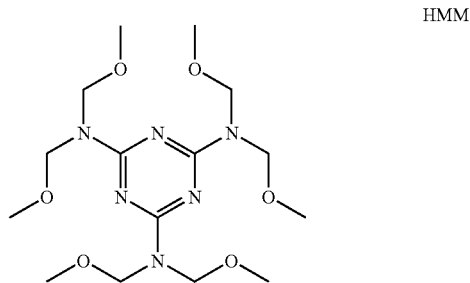

HMM

The antireflective film-forming compositions prepared in this manner were applied onto silicon substrates and baked at 200° C. for 120 seconds to obtain antireflective films 193 nm thick. After the antireflective films were formed, the refractive indices (n, k) of the antireflective films at a wavelength of 193 nm were obtained with a variable incidence angle spectroscopic ellipsometer (VASE) by J. A. Woollam Co., Inc. The results are shown in Table 1.

TABLE 1

| | Polymer Solution | Added Composition (wt %) Polymer (Solids Content) | Cross linking Agent | Acid Generator | Surfactant | Organic Solvent for dilution | Reflection Index (193 nm) n value | k value | SiO$_2$ wt % | Cross linking Group density mmol/g |
|---|---|---|---|---|---|---|---|---|---|---|
| Working Example 1 | Manufacturing Example 1 | 9.0 | 0.9 | 0.1 | 0.1 | PGMEA | 1.78 | 0.20 | 34.4 | 2.04 |
| Working Example 2 | Manufacturing Example 2 | 9.0 | 0.9 | 0.1 | 0.1 | PGMEA | 1.76 | 0.21 | 30.6 | 1.04 |
| Working Example 3 | Manufacturing Example 3 | 9.0 | 0.9 | 0.1 | 0.1 | PGMEA | 1.77 | 0.19 | 39.6 | 2.76 |

TABLE 1-continued

|  | Polymer Solution | Added Composition (wt %) Polymer (Solids Content) | Cross linking Agent | Acid Generator | Surfactant | Organic Solvent for dilution | Reflection Index (193 nm) n value | k value | SiO$_2$ wt % | Cross linking Group density mmol/g |
|---|---|---|---|---|---|---|---|---|---|---|
| Working Example 4 | Manufacturing Example 4 | 9.0 | 0.9 | 0.1 | 0.1 | PGMEA | 1.79 | 0.21 | 26 | 2.47 |
| Working Example 5 | Manufacturing Example 5 | 9.0 | — | 0.1 | 0.1 | PGMEA | 1.80 | 0.21 | 36.8 | 3.22 |
| Comparative Example 1 | Manufacturing Example 6 | 9.0 | 0.9 | 0.1 | 0.1 | EL | 1.81 | 0.23 | 45.9 | 7.71 |
| Comparative Example 2 | Manufacturing Example 7 | 9.0 | 0.3 | 0.1 | 0.1 | PnP | 1.77 | 0.23 | 76.8 | 0.9 |
| Comparative Example 3 | Manufacturing Example 8 | 9.0 | 0.9 | 0.1 | 0.1 | PGMEA | 1.76 | 0.24 | 18.8 | 3.6 |

SiO$_2$ amount (wt %): The wt % of the silicon atoms plus the oxygen atoms directly linked to the silicon atoms in the polymer, when all the silane hydrolyzing groups are changed to Si—O—Si, and all the crosslinks are formed.

Crosslinking group amount: The molar amount of groups that form crosslinks in 1 g of the polymer when all the silane hydrolyzing groups are changed to Si—O—Si, and all the crosslinks are formed.

As shown in Table 1, the antireflective films of the Working Examples and the Comparative Examples have a refractive index within the range of 1.5 to 1.9 and a k value greater than 0.15. It is clear that these antireflective films have ideal n and k values for attaining a sufficient antireflective effect.

[Preparation of the Photoresist Film Material]

The following polymer (Polymer A) was prepared as the base resin of the ArF photoresist film material.

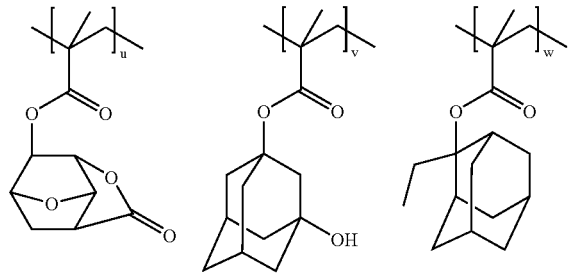

ArF single layer resist Polymer A
(u = 0.40, v = 0.30, w = 0.30 Mw 7,800)

Using the polymer prepared above (Polymer A), photoresist film material for ArF lithography was prepared at the compositions shown in Table 2.

The compositions in Table 2 are as follows.

Acid Generator: PAG1 (see following structural formula)

Organic Solvent: PGMEA (propylene glycol monomethyl ether acetate)

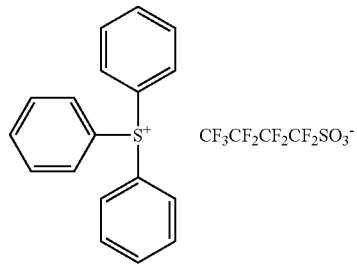

PAG1

[Observing the Pattern Shape and Etching Resistance Test]

(1) Observing the Pattern Shape

The antireflective film-forming compositions prepared above (Working Examples 1 to 5, Comparative Examples 1 to 3 in Table 1) were applied onto silicon substrates and baked at 200° C. for 120 seconds, forming antireflective films 193 nm thick.

Next, the ArF resist A solution prepared above was applied to the antireflective films at the combinations shown in Table 3 and baked at 130° C. for 60 seconds to prepare photoresist films 193 nm thick. Next, the photoresist films were exposed with an ArF exposure device (made by Nikon Co., Ltd.; S305B, NA 0.68, δ 0.85, ⅔ cycle illumination, Cr mask), baked at 110° C. for 90 seconds (PEB), and developed with a 2.38 wt % tetramethylammonium hydroxide (TMAH) aqueous solution, yielding positive resist patterns. The 0.12 μmL/S pattern shape of the pattern so obtained was observed.

TABLE 2

| Resist No. | Polymer (weight parts) | Acid Generator (weight parts) | Solvent (weight parts) |
|---|---|---|---|
| 1 | ArF single layer resist Polymer A (100) | PAG 1 (4.0) | PGMEA (1,200) |

TABLE 3

| Antireflective Film Material (Table 1) | Crosslinking Group Amount (mmol/g) | Line and Space Resist Pattern Shape |
|---|---|---|
| Working Example 1 | 2.04 | vertical, no tailing |
| Working Example 2 | 1.04 | vertical, no tailing |
| Working Example 3 | 2.76 | vertical, no tailing |
| Working Example 4 | 2.47 | vertical, no tailing |
| Working Example 5 | 3.22 | vertical, no tailing |

TABLE 3-continued

| Antireflective Film Material (Table 1) | Crosslinking Group Amount (mmol/g) | Line and Space Resist Pattern Shape |
|---|---|---|
| Comparative Example 1 | 7.71 | vertical, no tailing |
| Comparative Example 2 | 0.9 | intermixing, tailing |
| Comparative Example 3 | 3.6 | vertical, no tailing |

The amounts given in the table are as given below.
Crosslinking group amount: The molar amount of groups that form crosslinks in 1 g of the polymer when all the silane hydrolyzing groups are changed to Si—O—Si, and all the crosslinks are formed.

As a result, it was confirmed that intermixing has not occurred in the Working Examples 1 to 4 and the Comparative Examples 1 and 3, which have sufficient crosslinking. It is also confirmed that adhesion to the resist is excellent, without the occurrence of pattern toppling.

(2) Etching

The etching resistance of the antireflective films formed from the above antireflective film-forming compositions (Working Examples 1 to 5, Comparative Examples 1 to 3) and the photoresist films formed from the above photoresist film materials (resist 1) and the low dielectric film formed from the silicone manufactured in Manufacturing Example 8 was evaluated under the following two groups of conditions.

Etching Test with $CHF_3/CF_4$ Gases

The differences in film thickness of the antireflective film, the photoresist film, and the $SiO_2$ film before and after etching were measured using the dry-etching device TE-8500P made by Tokyo Electron Co., Ltd. The etching conditions were as follows. The results are shown in Table 4.

Chamber Pressure: 40.0 Pa
RF Power: 1,300 W
Gap: 9 mm
$CHF_3$ Gas Flow Amount: 30 ml/min
$CF_4$ Gas Flow Amount: 30 ml/min
Ar Gas Flow Amount: 100 ml/min
Time: 10 sec

TABLE 4

| Film Material (Table 1, 2) | $SiO_2$ Amount (wt) | $CHF_3/CF_4$ Gas Etching Speed (nm/min) |
|---|---|---|
| Working Example 1 | 34.4 | 460 |
| Working Example 2 | 30.6 | 420 |
| Working Example 3 | 39.6 | 495 |
| Working Example 4 | 26.0 | 380 |
| Working Example 5 | 36.8 | 480 |
| Comparative Example 1 | 45.9 | 560 |
| Comparative Example 2 | 76.8 | 705 |
| Comparative Example 3 | 18.8 | 205 |
| Resist 1 | 0 | 220 |
| Low Inductance Film | 88 | 800 |

The amounts given in the table are as given below.
$SiO_2$ amount (wt %): The wt % of the silicon atoms and the oxygen atoms directly linked to the silicon atoms in the polymer, when all the silane hydrolyzing groups are changed to Si—O—Si, and all the crosslinks are formed.

As shown in Table 4, the antireflective films formed from the antireflective film-forming compositions of the present invention (Working Examples 1 to 5) exhibited a dry etching speed with $CHF_3/CF_4$ gases that was sufficiently faster than that of the photoresist film. Furthermore, the etching speed of Comparative Example 3, which has reduced $SiO_2$, is of an equivalent rate as the resist, and thus it can be seen that it has no selectivity.

(3) Stripping

A solubility test was performed on the antireflective film formed from the antireflective film-forming composition (Working Examples 1 to 5, Comparative Examples 1 to 3), and the low dielectric film formed from the silicone manufactured in Manufacturing Example 8. A test piece was processed by the two standards described below.

Processing condition A: No processing after stripping
Processing condition B: Heating at 350° C. for 15 minutes at atmospheric pressure Stripping Fluid: EKC-2255 (manufactured by EKC Technology, Co., Ltd. basic stripping fluid): DHF (1% dilute Hydrofluoric Acid aqueous solution)

Stripping Conditions: EKC-2255, soaked for 10 minutes at 50° C. and DHF for 3 minutes at 20° C.

TABLE 5

| | Process | |
|---|---|---|
| | A | B |
| | Stripping Fluid | |
| Film Material | EKC-2255 Amount of Film Thickness Reduction (nm) | EKC-2255 Amount of Film Thickness Reduction (nm) |
| Working Example 1 | 3 | 23 |
| Working Example 2 | 3 | 18 |
| Working Example 3 | 3 | 15 |
| Working Example 4 | 5 | 30 |
| Working Example 5 | 3 | 15 |
| Comparative Example 1 | 0 | 5 |
| Comparative Example 2 | 0 | 0 |
| Comparative Example 3 | 10 | 30 |
| Low Inductance Film | 0 | 0 |

As shown in Table 5, the stripability of the antireflective films formed from the antireflective film-forming composition (Working Examples 1 to 5) of the present invention is better than the film of Comparative Example 3, which contains no non-crosslinking units. Furthermore, as with the low dielectric film, no change was observed in the film thickness of the high $SiO_2$ amount Comparative Example 2. Strippability of the Working Examples is much better than the inorganic crosslinking type antireflective films of the Comparative Examples, and strippability can be further improved by heating.

(4) Changes in Strippability with Heating Conditions.

The antireflective film formed from the antireflective film-forming composition (Working Examples 1 to 5, Comparative Examples 1 to 3) was heated, and strippability was measured.

Baking Conditions: 200° C. for 120 s
Heating Conditions: 180° C. for 15 min, 300° C. for 15 min, 400° C. for 15 min and 450° C. for 15 min at atmospheric pressure Stripping Fluid: EKC-2255 (manufactured by EKC Technology, basic stripping fluid)

Measured Variable: Amount of Film Thickness Reduction (nm)

TABLE 6

| Film Material | Heating Conditions | | | |
|---|---|---|---|---|
| | 180° C. for 15 min Film Thickness Reduction (nm) | 300° C. for 15 min Film Thickness Reduction (nm) | 350° C. for 15 min Film Thickness Reduction (nm) | 425° C. for 15 min Film Thickness Reduction (nm) |
| Working Example 1 | 3 | 33 | 23 | 1 |
| Working Example 2 | 3 | 35 | 18 | 2 |
| Working Example 3 | 3 | 8 | 15 | 1 |
| Working Example 4 | 5 | 38 | 30 | 2 |
| Working Example 5 | 3 | 28 | 15 | 3 |
| Comparative Example 1 | 0 | 20 | 5 | 1 |
| Comparative Example 2 | 0 | 0 | 0 | 0 |
| Comparative Example 3 | 10 | 30 | 30 | 3 |
| Low Inductance Film | 0 | 0 | 0 | 0 |

As can be seen in Table 6, strippability of Working Examples 1 to 5 is not observed at 180° C., however strippability is observed from 300° C. to 350° C. That extent is also different depending on the structure of the polymer, and depending on the temperature. Strippability is lost again at 425° C., however this is because the film is ceramicized.

[Observation of Baking Film Formation by IR]

An FT-IR was measured when the material in Working Example 1 in Table 6 was baked. The measuring conditions are as given below.

Measuring device: An FT-IR measuring device, JIR-5500, made by JEOL, Co., Ltd.

Measuring method: Measures the difference between a silicon substrate without an antireflective film, and a silicon substrate that is provided with an antireflective film.

Figure 2:
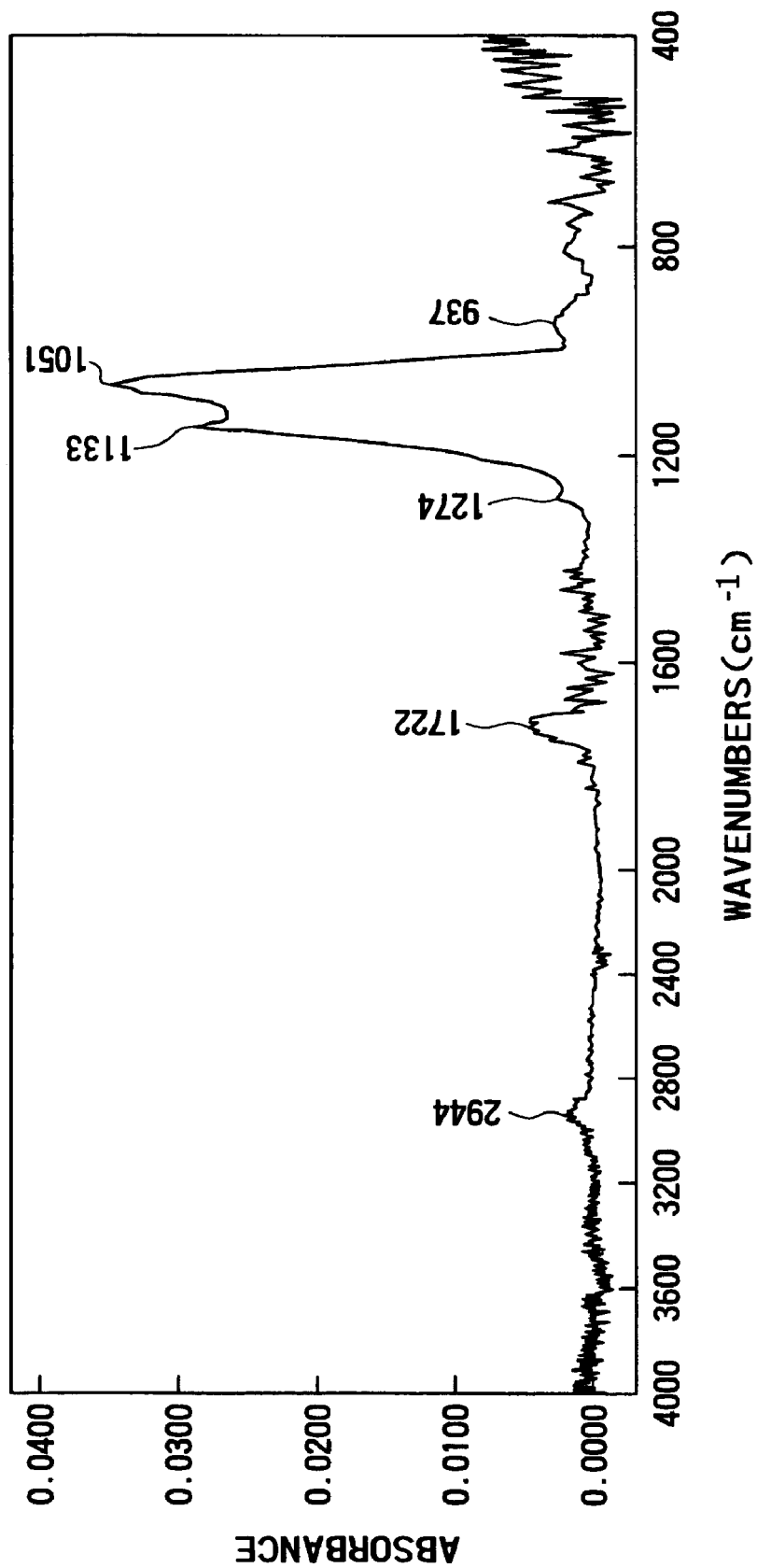
FIG. 2 shows an IR chart of a case in which a material of a first working example was baked at 300° C. for 15 min.
Figure 3:
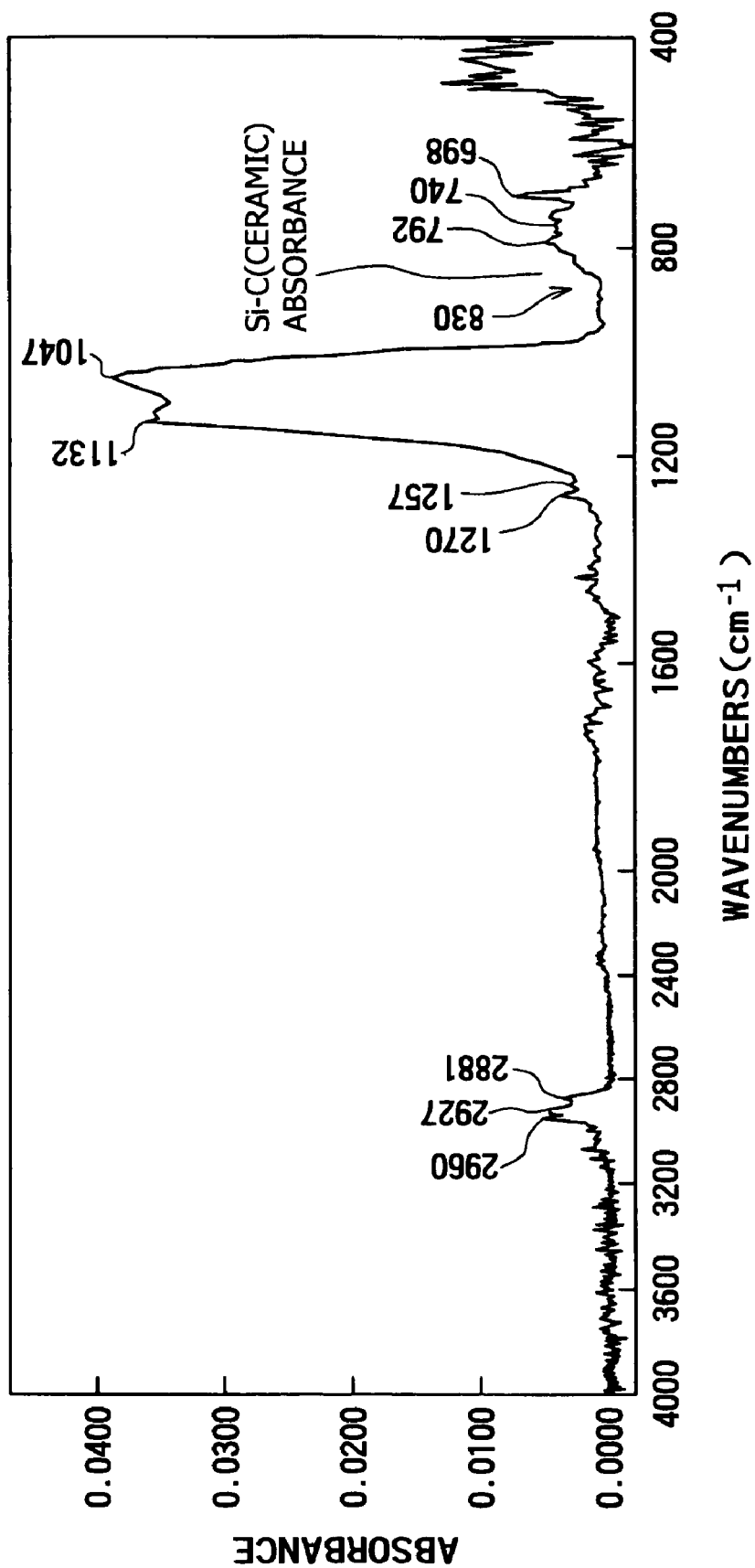
FIG. 3 shows an IR chart of a case in which a material of the first working example was baked at 450° C. for 15 min.

FIG. 2 shows an IR chart of material baked at temperature conditions of 300° C. for 15 min. At the conditions of 300° C. for 15 min, absorption caused by SiC (820 cm$^{-1}$) was not observed. FIG. 3 shows an IR chart of a material baked at the temperature conditions of 425° C. for 15 min. At 425° C. for 15 min, absorption caused by SiC was observed at 820 cm$^{-1}$, and it seemed to be ceramicized.

What is claimed is:

1. An antireflective film-forming composition, comprising:
an organic solvent;
an acid generator; and
a polymer expressed by Formula (1) which is a copolymer polymerized using a basic catalyst of tetramethylammonium hydroxide, comprising monomer units Ua, Ub and Uc:

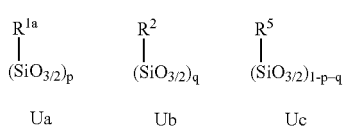

(1)

wherein $R^{1a}$ is a monovalent organic group capable of crosslinking selected from 3,4-epoxycyclohexyl-ethyl and hydroxyl-propyl; $R^2$ is phenyl; $R^5$ is a monovalent organic group incapable of crosslinking selected from 3-(2'-methoxypropoxy)propyl and 2,3-dimethoxypropoxypropyl; p is a number in the range 0<p <1, q is a number in the range 0<q<1, wherein p+q<1.

2. The antireflective film-forming composition according to claim 1;
wherein the total concentration of the organic groups capable of crosslinking in the polymer expressed by Formula (1) is about 1 mmol to 7 mmol per 1 g of solid content of the polymer.

3. The antireflective film-forming composition according to claim 1;
wherein the total content of silicon atoms and oxygen atoms directly attached to silicon atoms in the polymer expressed by Formula (1) is not less than 20 weight % and not more than 70 weight %.

4. The antireflective film-forming composition according to claim 1, further comprising a crosslinking agent.

5. An antireflective film-forming composition, comprising:
an organic solvent;
an acid generator; and
a polymer expressed by Formula (2) polymerized using a basic catalyst of tetramethylammonium hydroxide, comprising monomer units Ua, Ub and Uc:

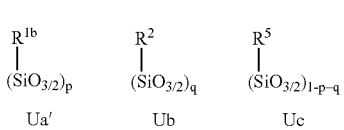

(2)

wherein $R^{1b}$ is a group obtained by reacting the epoxy group of 3,4-epoxycyclohexyl-ethyl group with a carboxylic acid compound; $R^2$ is phenyl; $R^5$ is a monovalent organic group incapable of crosslinking selected from 3-(2'-methoxypropoxy)propyl and 2,3-dimethoxypropoxypropyl; p is a number in the range 0<p <1, q is a number in the range 0<q<1, wherein p+q<1.

6. The antireflective film-forming composition according to claim 5, further comprising:
a polymer expressed by Formula (1), which is a copolymer polymerized using a basic catalyst of tetramethylammonium hydroxide, comprising monomer units Ua, Ub and Uc:

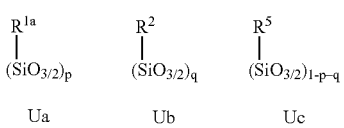

(1)

wherein $R^{1a}$ is a monovalent organic group capable of crosslinking selected from 3,4-epoxycyclohexyl-ethyl and hydroxyl-propyl; $R^2$ is phenyl; $R^5$ is a monovalent organic group incapable of crosslinking selected from 3-(2'-methoxypropoxy)propyl and 2,3-dimethoxypropoxypropyl; p is a number in the range 0<p <1, and q is a number in the range 0<q<1, and wherein p+q<1.

7. The antireflective film-forming composition according to claim 5;

wherein the concentration of the organic groups capable of crosslinking in the polymer expressed by Formula (2) is about 1 mmol to 7 mmol per 1 g of solid content of the polymer.

8. The antireflective film-forming composition according to claim 5;
wherein the total content of silicon atoms and oxygen atoms directly attached to silicon atoms in the polymer expressed by Formula (2) is not less than 20 weight % and not more than 70 weight %.

* * * * *